(12) United States Patent
Tseng et al.

(10) Patent No.: US 10,014,063 B2
(45) Date of Patent: Jul. 3, 2018

(54) SMART SKIP VERIFY MODE FOR PROGRAMMING A MEMORY DEVICE

(71) Applicant: SanDisk Technologies Inc., Plano, TX (US)

(72) Inventors: Huai-Yuan Tseng, San Ramon, CA (US); Deepanshu Dutta, Fremont, CA (US); Tai-Yuan Tseng, Milpitas, CA (US); Grishma Shah, Milpitas, CA (US); Muhammad Masuduzzaman, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 12 days.

(21) Appl. No.: 14/928,853

(22) Filed: Oct. 30, 2015

(65) Prior Publication Data

US 2017/0125117 A1    May 4, 2017

(51) Int. Cl.
*G11C 16/34* (2006.01)
*G11C 16/10* (2006.01)
*G11C 11/56* (2006.01)

(52) U.S. Cl.
CPC ...... *G11C 16/3459* (2013.01); *G11C 11/5628* (2013.01); *G11C 16/10* (2013.01)

(58) Field of Classification Search
CPC . G11C 16/3459; G11C 16/3454; G11C 16/10; G11C 16/0483
USPC .......................... 365/185.22, 185.17, 185.24
See application file for complete search history.

(56) References Cited

U.S. PATENT DOCUMENTS

| | | | |
|---|---|---|---|
| 7,073,103 B2 | 7/2006 | Gongwer et al. | |
| 7,092,290 B2 * | 8/2006 | Hemink | G11C 11/5628 365/185.17 |
| 7,251,160 B2 | 7/2007 | Li et al. | |
| 7,301,817 B2 | 11/2007 | Li et al. | |
| 7,327,619 B2 | 2/2008 | Chan et al. | |
| 7,492,640 B2 | 2/2009 | Mokhlesi | |
| 7,688,638 B2 | 3/2010 | Hemink | |
| 7,768,836 B2 | 8/2010 | Li et al. | |
| 7,948,804 B2 | 5/2011 | Komatsu | |
| 8,539,138 B2 | 9/2013 | Kim et al. | |
| 8,787,093 B2 | 7/2014 | Komatsu | |
| 8,897,085 B2 | 11/2014 | Li | |
| 8,953,372 B2 | 2/2015 | Meir et al. | |
| 9,142,298 B2 | 9/2015 | Dong et al. | |
| 2010/0226171 A1 | 9/2010 | Han | |

(Continued)

*Primary Examiner* — Alexander Sofocleous
*Assistant Examiner* — Alfredo Bermudez Lozada
(74) *Attorney, Agent, or Firm* — Vierra Magen Marcus LLP

(57) ABSTRACT

Techniques are provided to adaptively determine when to begin verify tests for a particular data state based on a programming progress of a set of memory cells. A count is made in a program-verify iteration of memory cells which pass a verify test of a state N. The count is used to determine a subsequent program-verify iteration in which to perform a verify test of a higher state as a function of an amount by which the count exceeds a threshold count. In another approach, an optimum verify scheme is implemented on a per-group basis for groups of adjacent memory cells at different heights in a 3D memory device. In another approach, an optimum verify scheme is implemented on a per-layer basis for sets of memory cells at a common height or word line layer in a 3D memory device.

20 Claims, 28 Drawing Sheets

(56) References Cited

U.S. PATENT DOCUMENTS

| | | |
|---|---|---|
| 2011/0122692 A1 | 5/2011 | Dutta et al. |
| 2012/0140566 A1* | 6/2012 | Aritome ............... G11C 11/5628 365/185.19 |
| 2013/0077409 A1* | 3/2013 | Shiino ................ G11C 16/3459 365/185.22 |
| 2014/0226406 A1* | 8/2014 | Dong .................. G11C 11/5628 365/185.17 |
| 2014/0250260 A1 | 9/2014 | Yap |
| 2014/0254283 A1 | 9/2014 | Dong et al. |

* cited by examiner

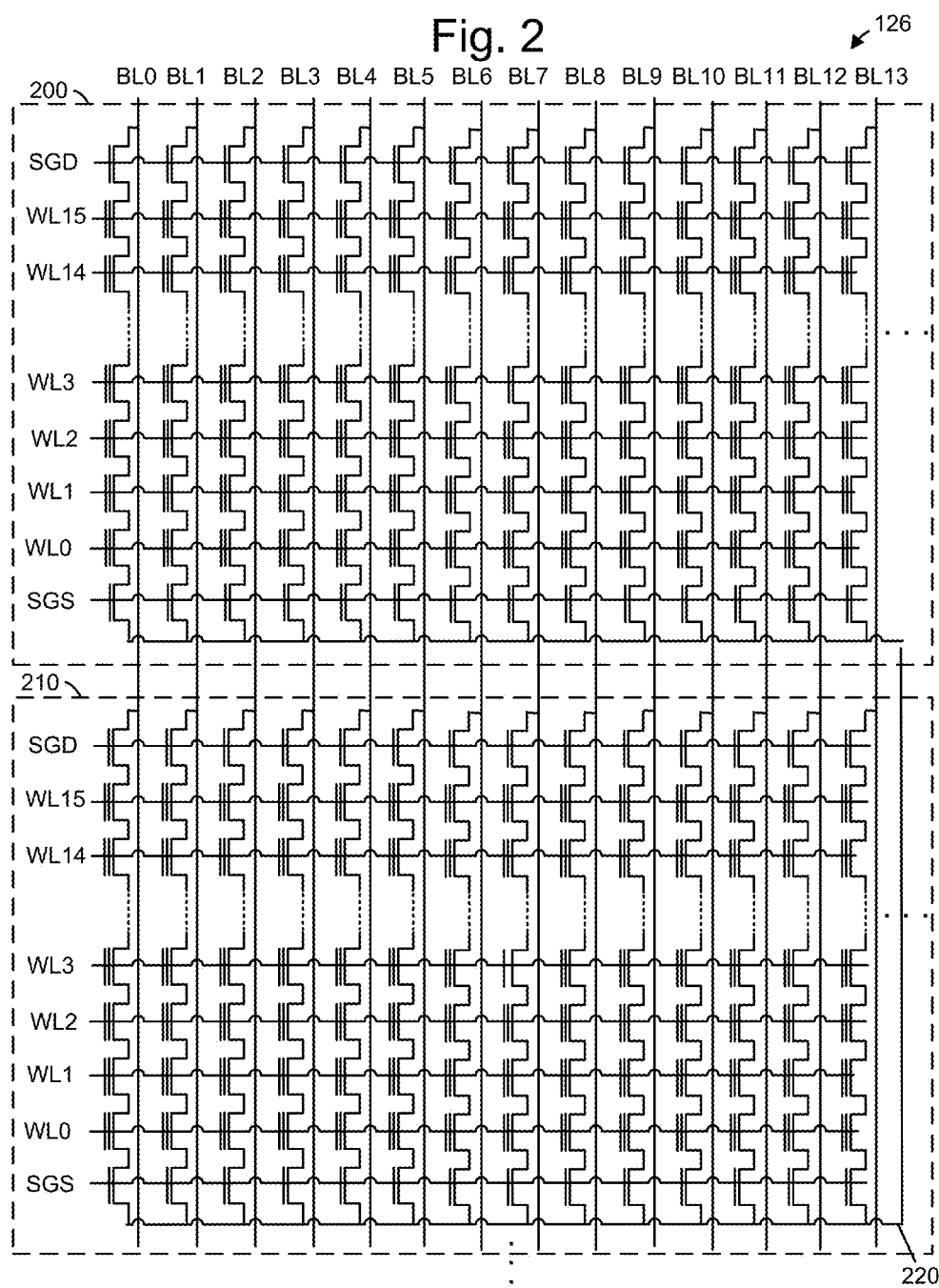

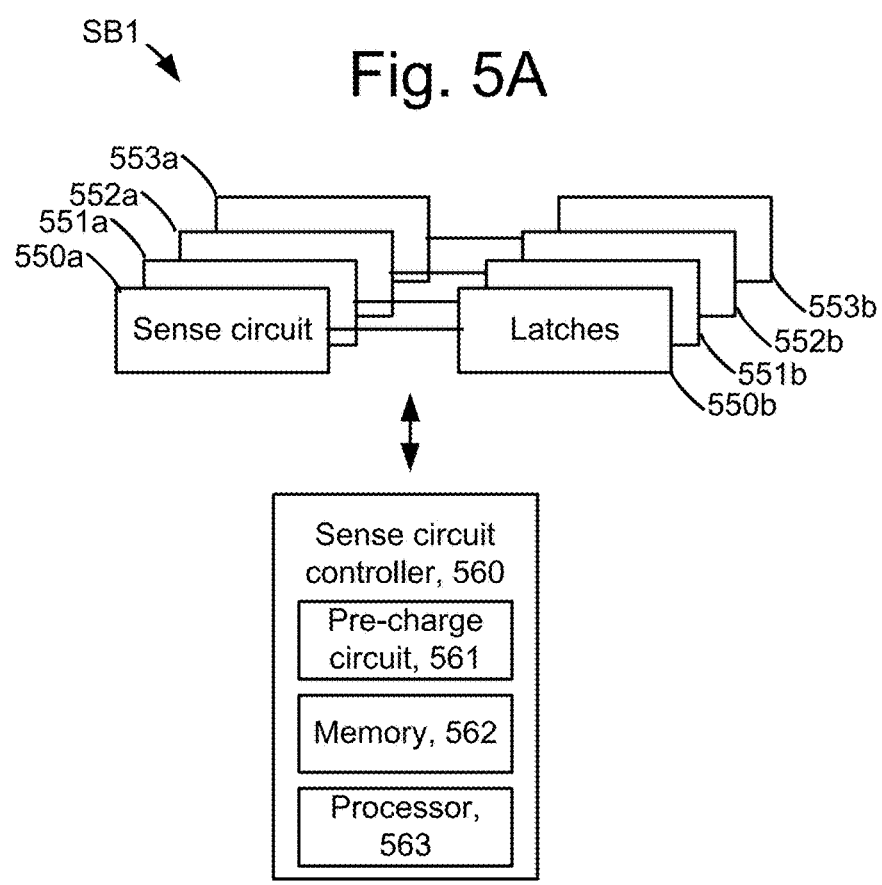

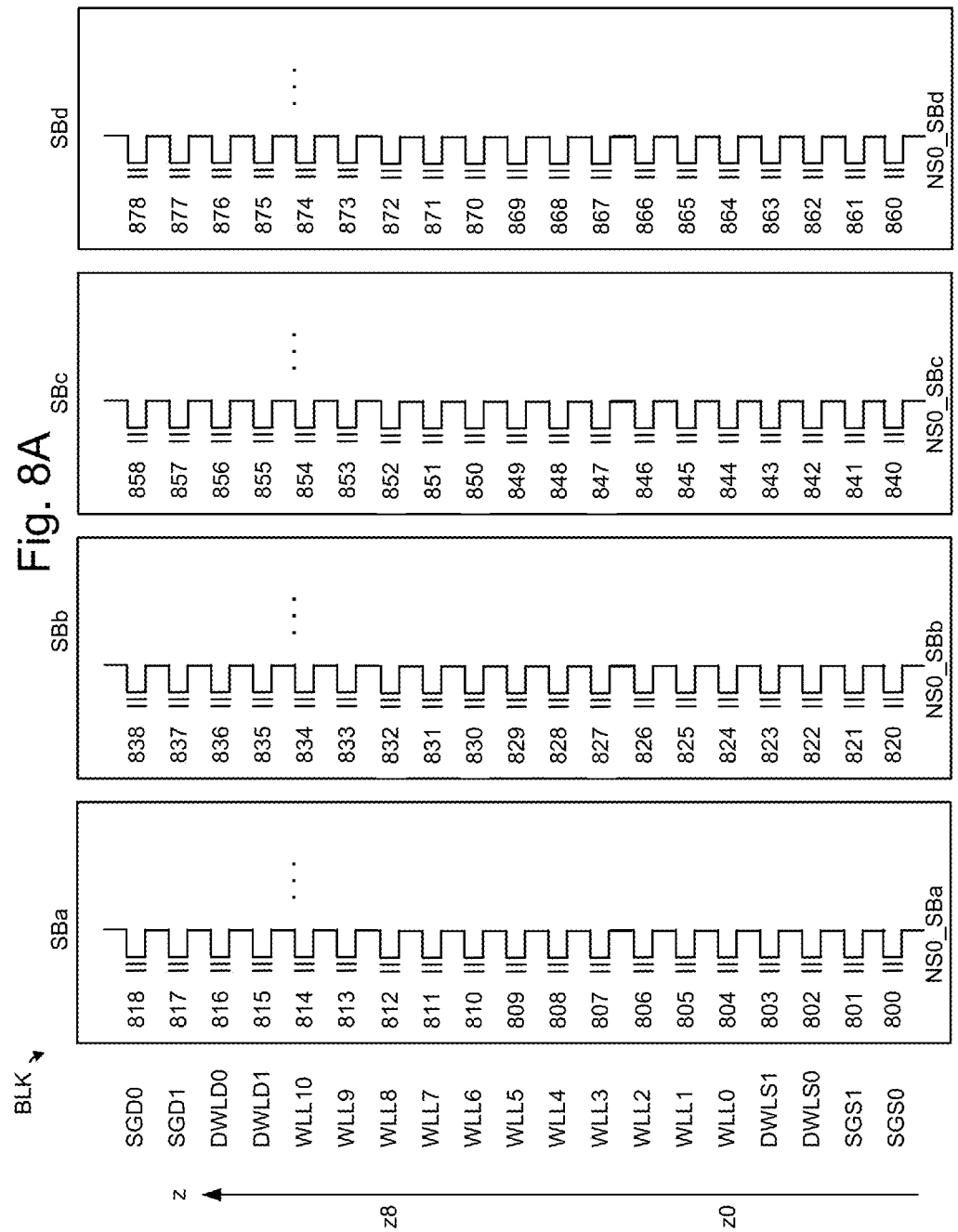

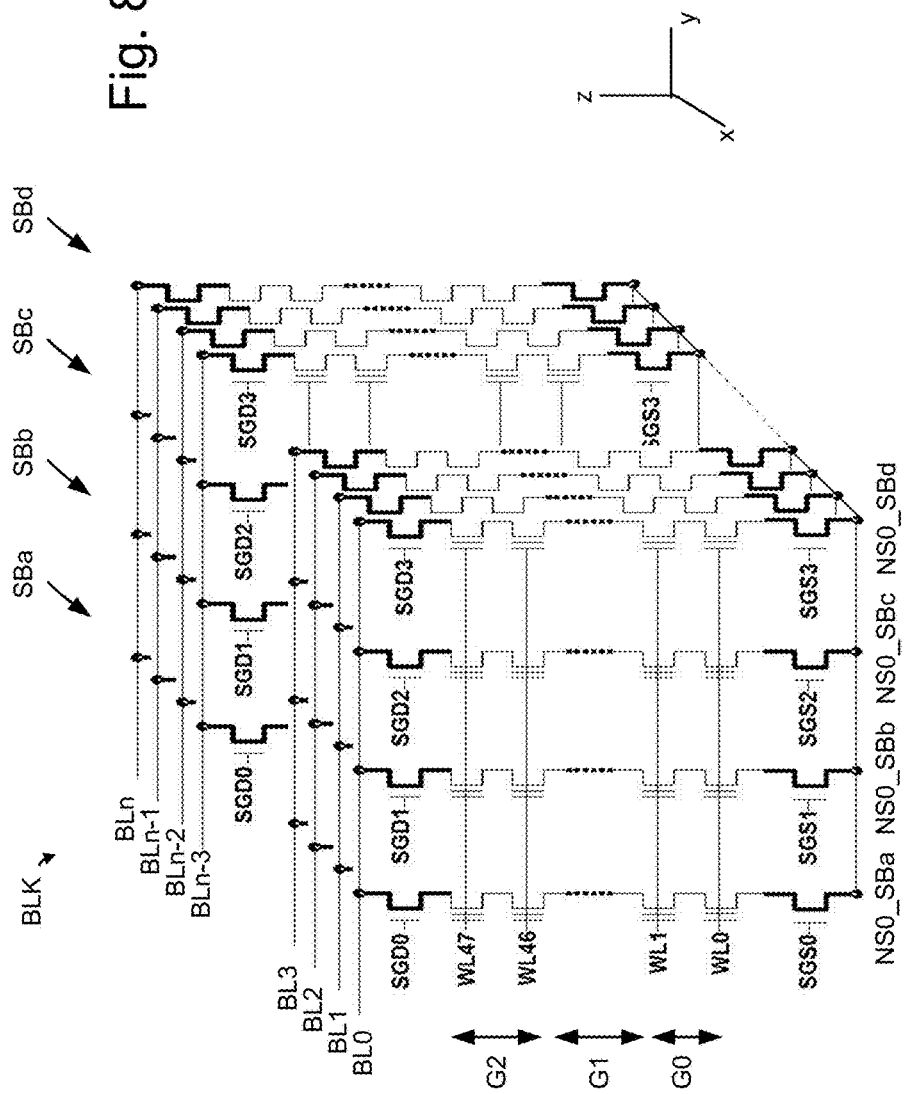

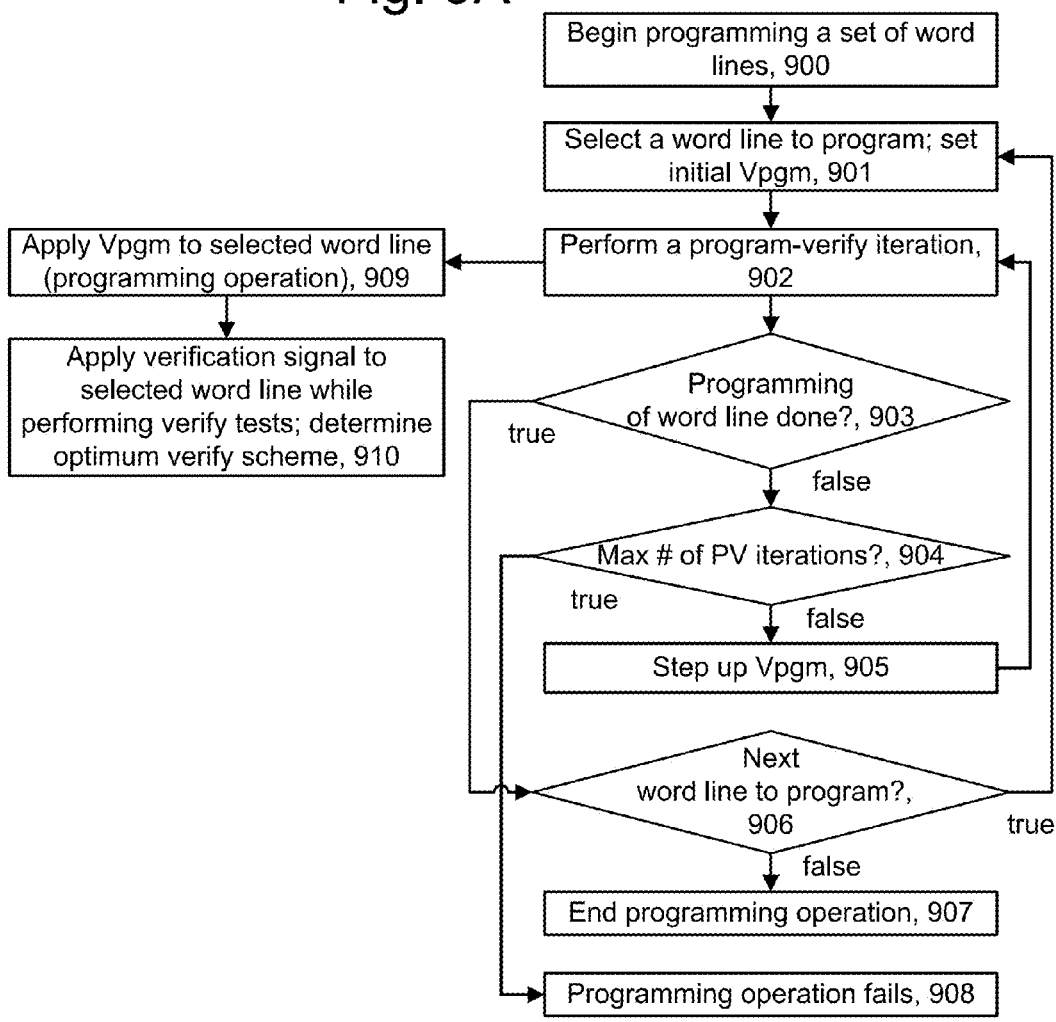

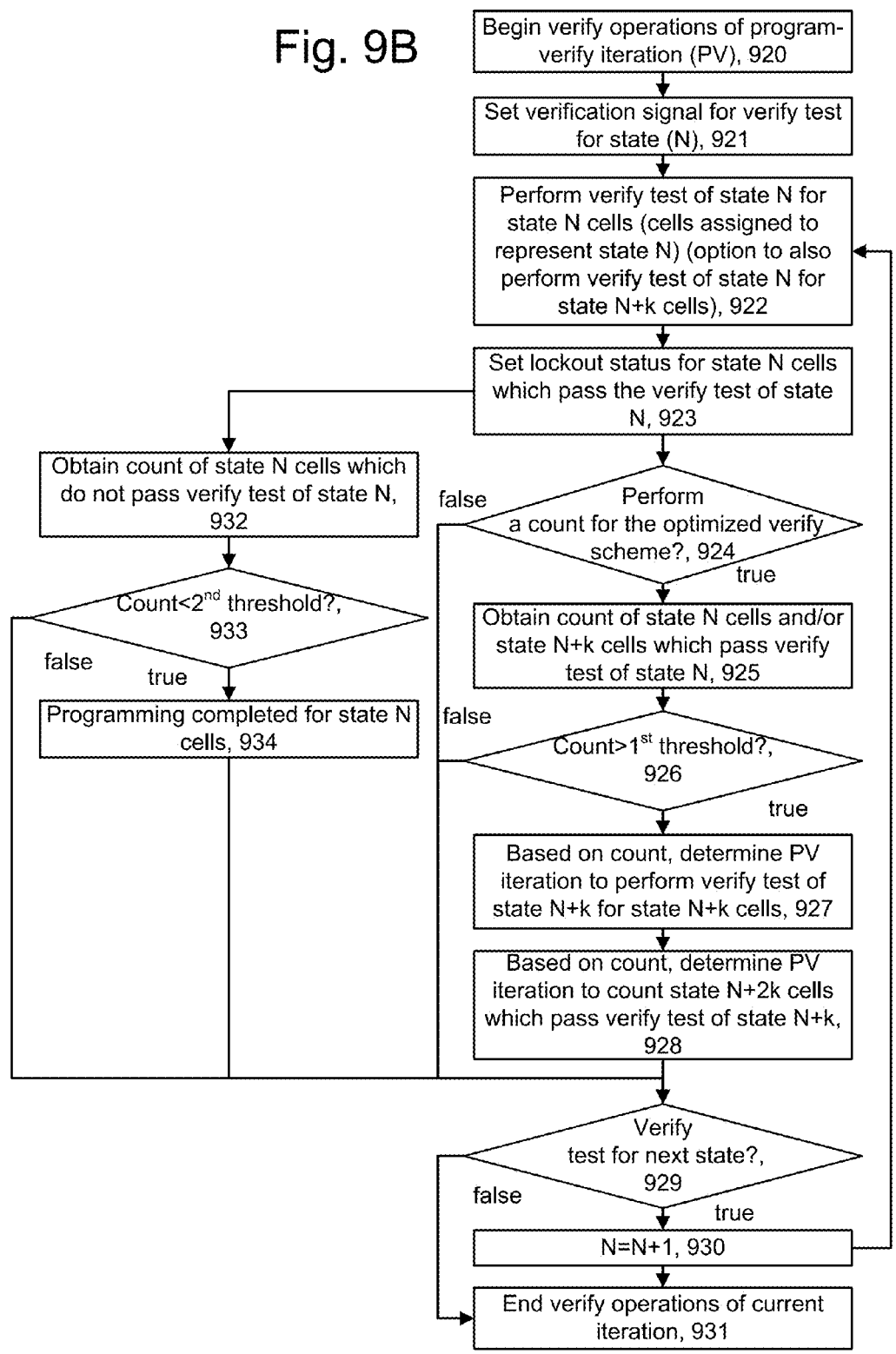

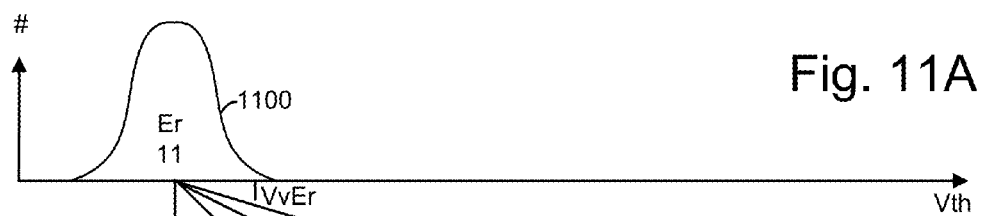
Fig. 11A
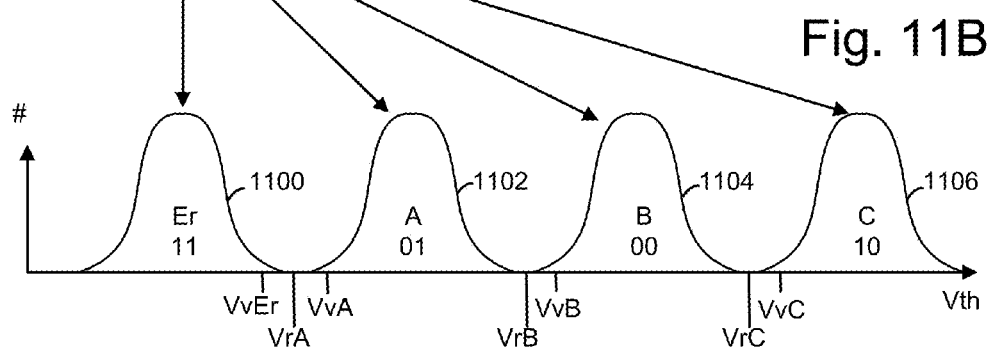
Fig. 11B
Fig. 11C
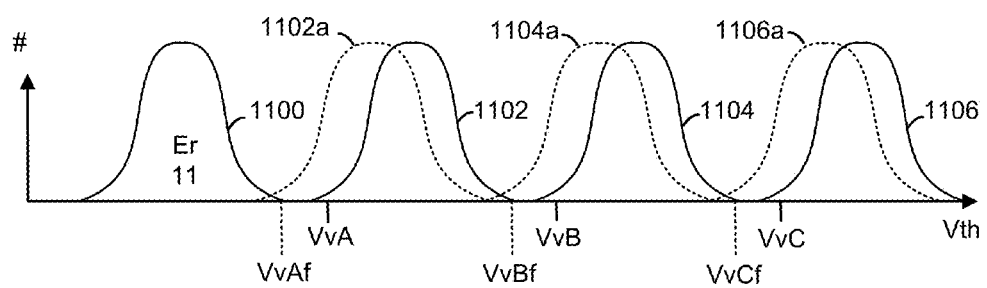
Fig. 11D
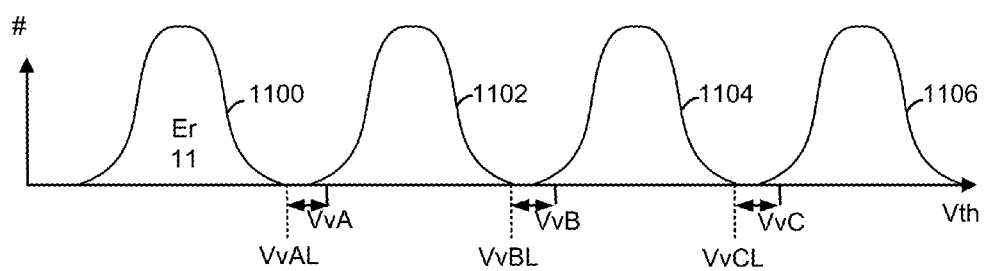

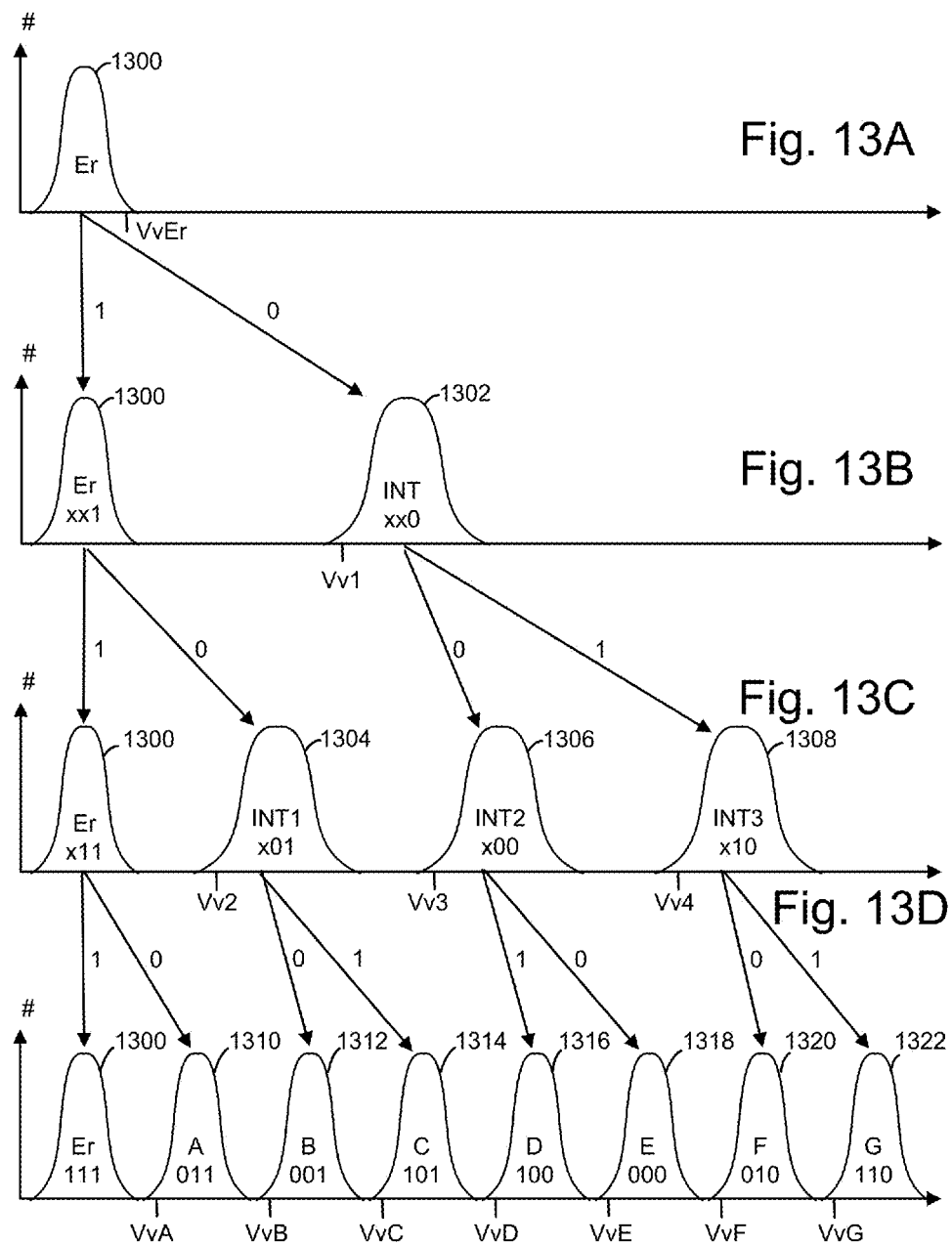

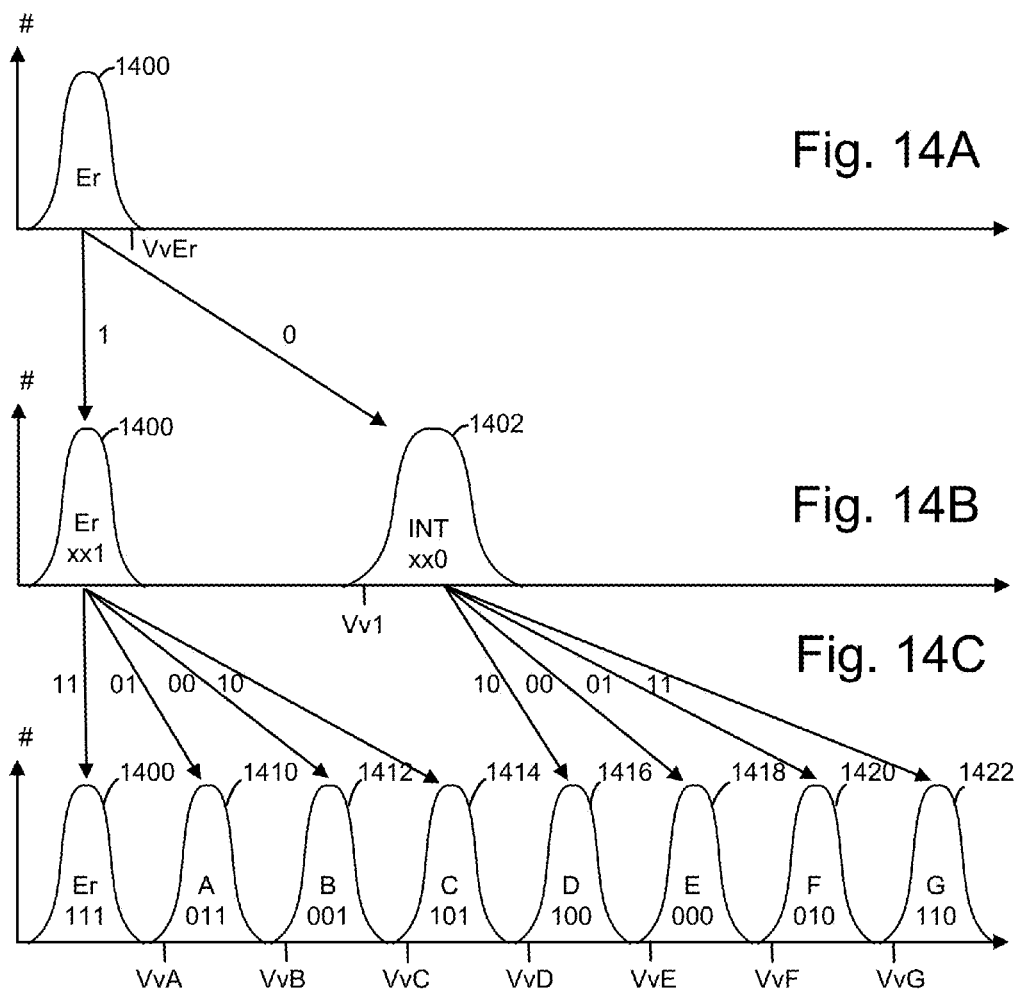

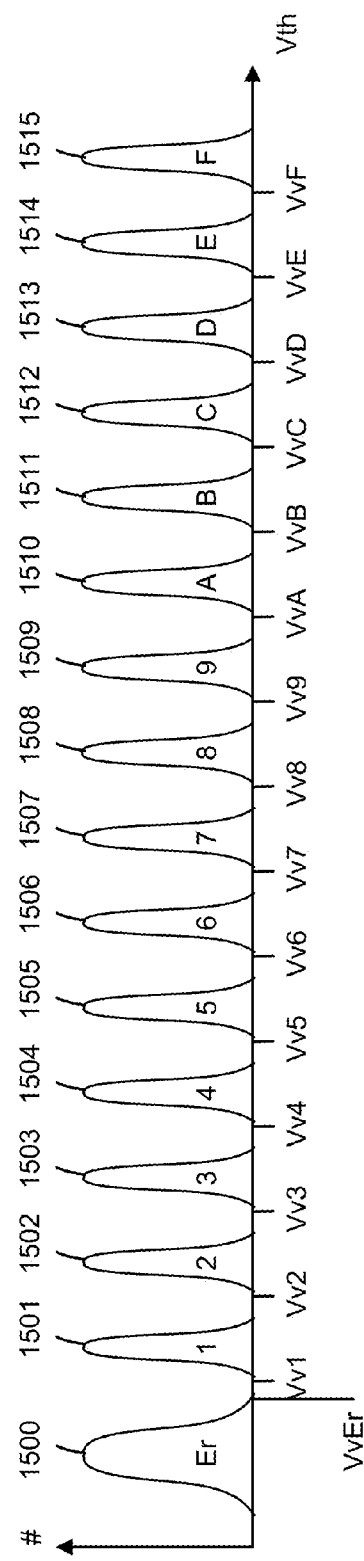

SMART SKIP VERIFY MODE FOR PROGRAMMING A MEMORY DEVICE

BACKGROUND

The present technology relates to operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 2 depicts blocks of memory cells in an example two-dimensional configuration of the memory array 126 of FIG. 1.

FIG. 5A depicts an example block diagram of the sense block SB1 of FIG. 1.

FIG. 7A depicts a top view of an example word line layer WLL0 of the stack of FIG. 6B.

FIG. 7B depicts a top view of an example top dielectric layer DL19 of the stack of FIG. 6B.

FIG. 8A depicts example NAND strings in the sub-blocks SBa-SBd of FIG. 7A.

FIG. 8B depicts another example view of NAND strings in sub-blocks.

FIG. 9A is a flowchart of an example programming operation in a memory device.

FIG. 9B is a flowchart of an example verify operation consistent with step 910 of FIG. 9A.

FIGS. 11A and 11B depict Vth distributions of memory cells in an example one-pass programming operation with four data states, consistent with FIG. 9A.

FIG. 11C depicts Vth distributions of memory cells after a first pass (a foggy pass) and a second pass (a fine pass) of an example two-pass programming operation with four data states, consistent with FIG. 9A.

FIG. 11D depicts Vth distributions of memory cells in a one-pass programming operation which uses a slowdown measure.

FIG. 13A to 13D depict Vth distributions of memory cells in a three-pass programming operation with eight data states, consistent with FIG. 9A.

FIG. 14A to 14C depict Vth distributions of memory cells in a two-pass programming operation with eight data states, consistent with FIG. 9A.

FIG. 15 depicts a threshold voltage (Vth) distribution of a set of memory cells along with verify voltages, where there are sixteen data states.

DETAILED DESCRIPTION

Figure 1A:
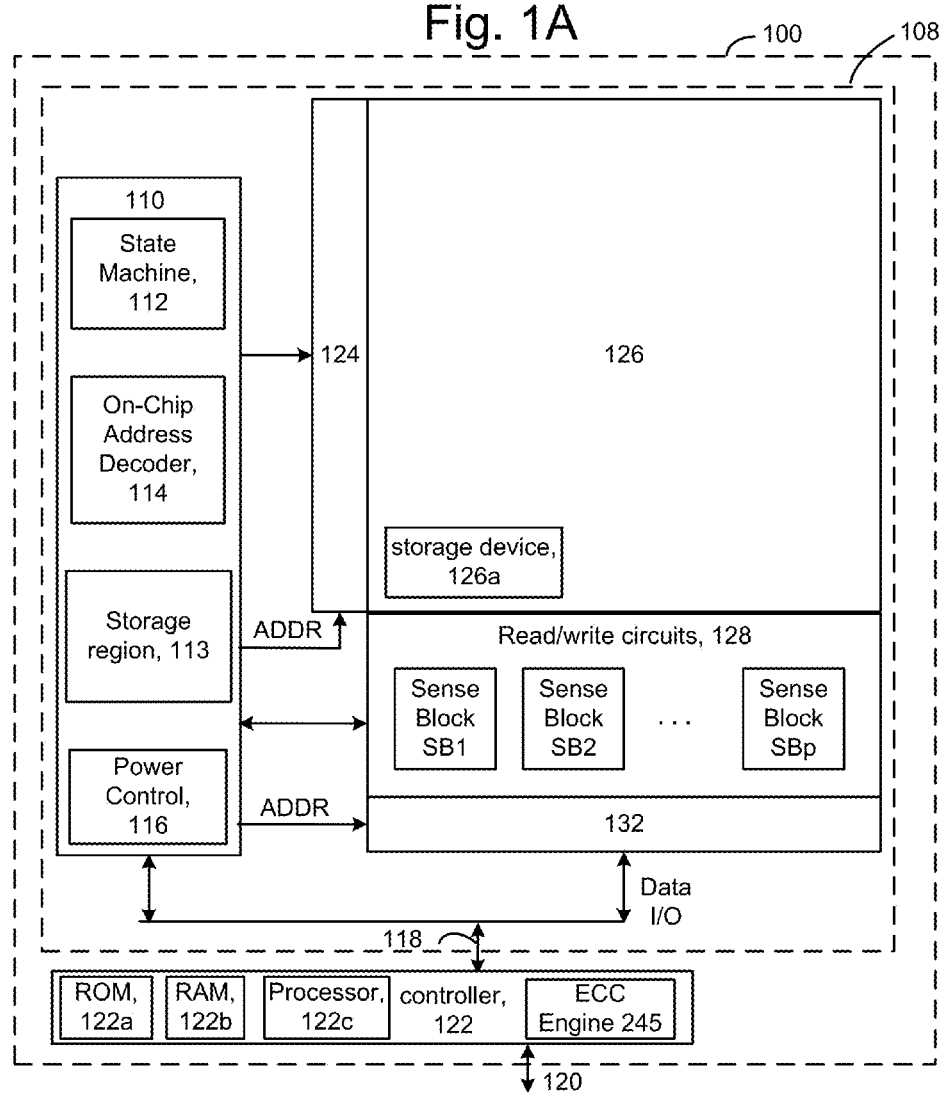
FIG. 1A is a block diagram of an example memory device.

Techniques are provided for programming a memory device in which verify operations are optimized. A corresponding memory device is also provided.

A programming operation for a set of memory cells typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a data state (a programmed data state) different from the erased state. For example, in a two-bit per cell memory device, there are four data states including the erased state and three higher data states referred to as the A, B and C data states (see FIG. 11B). In a three-bit per cell memory device, there are eight data states including the erased state and seven higher data states referred to as the A, B, C, D, E, F and G data states (see FIG. 13D). In a four-bit per cell memory device, there are sixteen data states including the erased state and fifteen higher data states referred to as the Er, 1, 2, 3, 4, 5, 6, 7, 8, 9, A, B, C, D, E and F data states (see FIG. 15).

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

The verify voltage which is used to determine that a memory cell has completed programming may be referred to as a final or lockout verify voltage. In some cases, an additional verify voltage may be used to determine that a memory cell is close to completion of the programming. This additional verify voltage may be referred to as an offset verify voltage, and can be lower than the final verify voltage. When a memory cell is close to completion of programming, the programming speed of the memory cell can be reduced such as by elevating a voltage of a respective bit line during one or more subsequent program voltages. For example, in FIG. 11D, a memory cell which is to be programmed to the A data state can be subject to verify tests at VvAL, an offset verify voltage of the A data state, and VvA, a final verify voltage of the A data state. By slowing the programming speed just before a memory cell completes programming, narrower Vth distributions can be achieved.

However, time is consumed in performing the verify tests. For example, typically, a verify test involves applying a verification signal to the control gates of the selected memory cells via a selected word line, pre-charging sense circuits which are connected to the selected memory cells via respective bit lines and observing an amount of discharge in the sense circuits for a specified discharge period. Moreover, this is repeated for each verify voltage of the verification signal. Moreover, the time consumed will increase as the number of data states increases, such as with a 16 state memory device having a Vth distribution such as in FIG. 15.

A verify scheme can be defined in which the number of verify tests is optimized, e.g., by avoiding unnecessary verify tests. The verify test for a data state should be skipped until the upper tail of the Vth distribution approaches the verify voltage of the state. One approach is to specify based on empirical data, which verify tests are to be performed in which program-verify iterations. This approach may be satisfactory when there are a small number of data states and program-verify iterations. However, this approach become less efficient when there are a large number of data states and program-verify iterations.

Techniques provided herein adaptively determine when to begin verify tests for a particular data state based on a programming progress of a set of memory cells. In one approach, a count is made in a program-verify iteration of memory cells which pass a verify test of a state N. The count is used to determine a subsequent program-verify iteration in which to perform a verify test of a higher state, N+k, where k is a positive integer, e.g., 1, 2, . . . . Moreover, the subsequent program-verify iteration can be determined adaptively as a function of an amount by which the count exceeds a threshold count. If the amount is relatively small, the Vth distribution of the memory cells assigned to the N+k state is relatively far from the verify voltage of the N+k state, so that a number of program-verify iterations to skip before the subsequent program-verify iteration is relatively large. If the amount is relatively large, the Vth distribution of the memory cells assigned to the N+k state is relatively close to the verify voltage of the N+k state, so that a number of program-verify iterations to skip before the subsequent program-verify iteration is relatively small.

The value of k can be set based on factors such as the program pulse step size and the program slope, which is the increase in Vth for a given increase in the program voltage, Vpgm. k should be relatively large when the step size and program slope is relatively large. In this case, the Vth distribution can increase a relatively large amount with each program voltage, so the program-verify iteration in which the count is made should be relatively far below the subsequent program-verify iteration. An example is k=1, 2 or 3.

In another approach, an optimum verify scheme is implemented on a per-group basis for groups of adjacent memory cells at different heights in a stack of a 3D memory device. In another approach, an optimum verify scheme is implemented on a per-layer basis for sets of memory cells at a common height or word line layer in a stack of a 3D memory device.

Various other features and benefits are described below.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for verify parameters as described herein. These can be parameters related to a verify scheme, such as discussed in connection with steps FIG. 9A-9E.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a programming operation for one set of memory cells, wherein: the one set of memory cells comprises memory cells assigned to represent one data state among a plurality of data states and memory cells assigned to represent another data state among the plurality of data states; the programming operation comprising a plurality of program-verify iterations; and in each program-verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program-verify iteration among the plurality of program-verify iterations in which to perform a verify test for the another data state for the memory cells assigned to represent the another data state.

Figure 1B:
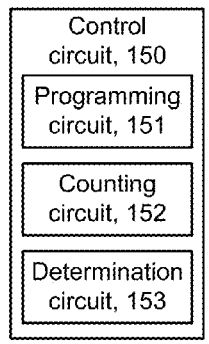
FIG. 1B is a block diagram of an example control circuit 150 which comprises a programming circuit 151, a counting circuit 152 and a determination circuit 153.

For example, FIG. 1B is a block diagram of an example control circuit 150 which comprises a programming circuit 151, a counting circuit 152 and a determination circuit 153. The programming circuit may include software, firmware and/or hardware which implements, e.g., steps 900-908 of FIG. 9A. The counting circuit may include software, firmware and/or hardware which implements, e.g., steps 925 and 932 of FIG. 9B. The determination circuit may include software, firmware and/or hardware which implements, e.g., step 927 of FIG. 9B.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exists in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 2 depicts blocks of memory cells in an example two-dimensional configuration of the memory array 126 of FIG. 1. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3A:
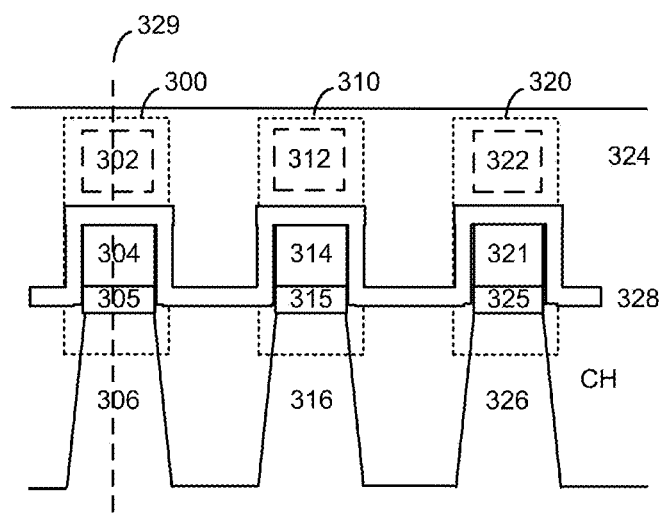
FIG. 3A depicts a cross-sectional view of example floating gate memory cells in NAND strings.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
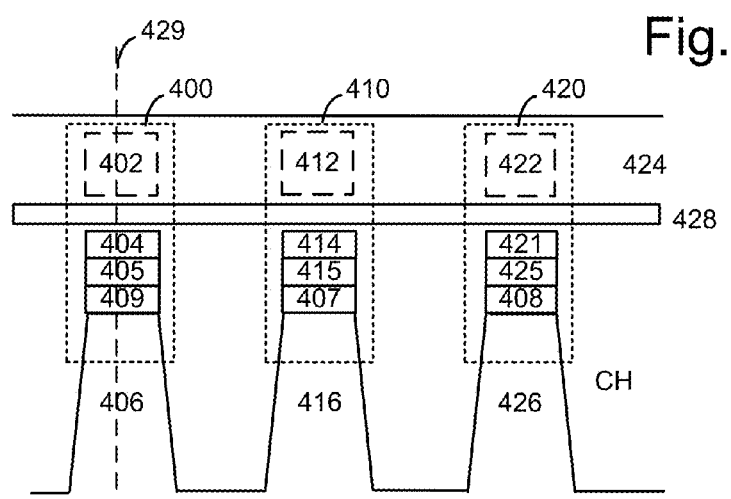
FIG. 4A depicts a cross-sectional view of example charge-trapping memory cells in NAND strings.
Figure 4B:
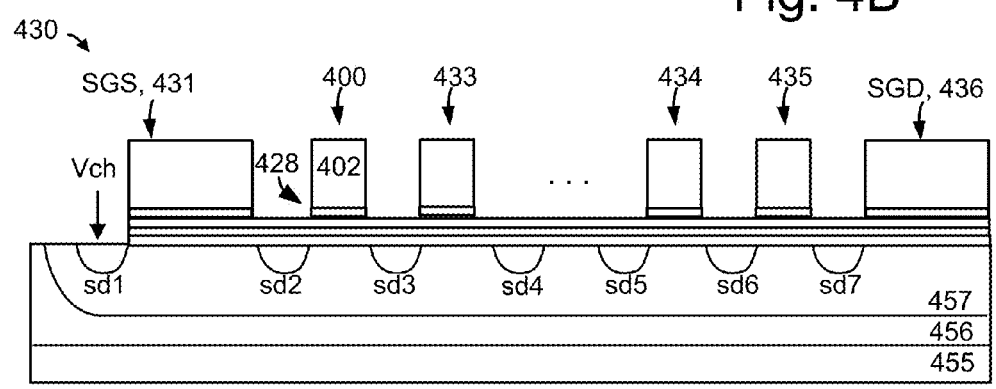
FIG. 4B depicts a cross-sectional view of the structure of FIG. 4A along line 429.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
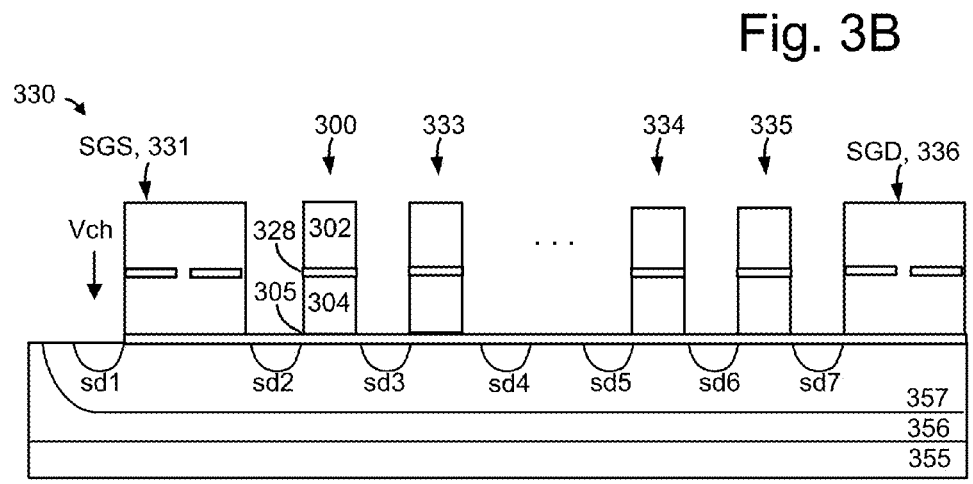
FIG. 3B depicts a cross-sectional view of the structure of FIG. 3A along line 329.

FIG. 3B depicts a cross-sectional view of the structure of FIG. 3A along line 329. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 435.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 5B:
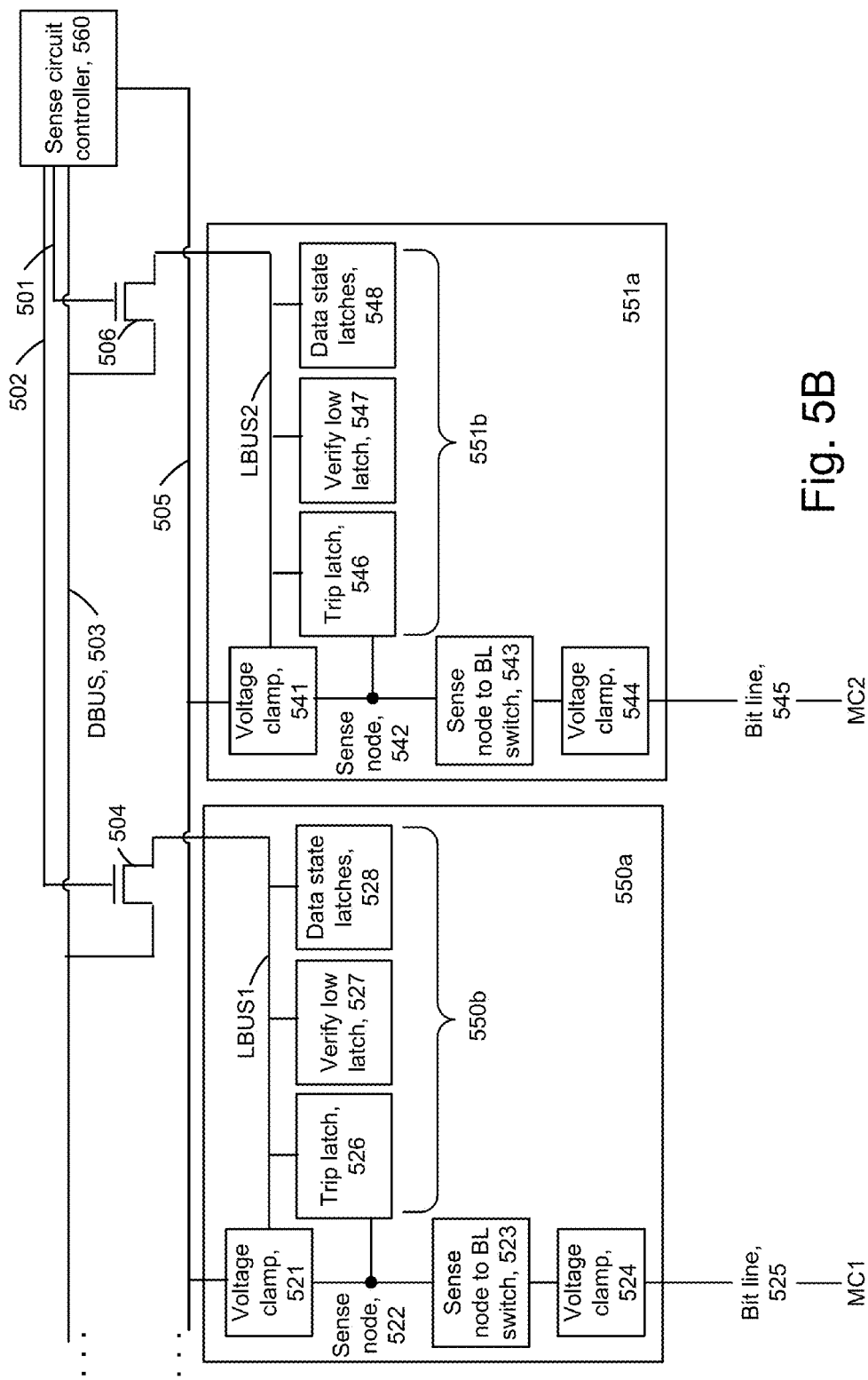
FIG. 5B depicts another example block diagram of the sense block SB1 of FIG. 1.

FIG. 5A depicts an example block diagram of the sense block SB1 of FIG. 1. In one approach, a sense block comprises multiple sense circuits. Each sense circuit is associated with data latches. For example, the example sense circuits 550a, 551a, 552a and 553a are associated with the data latches 550b, 551b, 552b and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller may include a pre-charge circuit 561 which provides a voltage to each sense circuit for setting a pre-charge voltage. In one possible approach, the voltage is provided to each sense circuit independently, e.g., via the data base 503 and a local bus such as LBUS1 or LBUS2 in FIG. 5B. In another possible approach, a common voltage is provided to each sense circuit concurrently, e.g., via the line 505 in FIG. 5B. The sense circuit controller may also include a memory 562 and a processor 563. As mentioned also in connection with FIG. 2, the memory 562 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 550a and 551a are provided below.

FIG. 5B depicts another example block diagram of the sense block SB1 of FIG. 1. The sense circuit controller 560 communicates with multiple sense circuits including example sense circuits 550a and 551a, also shown in FIG. 5A. The sense circuit 550a includes latches 550b, including a trip latch 526, an offset verify latch 527 and data state latches 528. The sense circuit further includes a voltage clamp 521 such as a transistor which sets a pre-charge voltage at a sense node 522. A sense node to bit line (BL) switch 523 selectively allows the sense node to communicate with a bit line 525, e.g., the sense node is electrically connected to the bit line so that the sense node voltage can decay. The bit line 525 is connected to one or more memory cells such as a memory cell MC1. A voltage clamp 524 can set a voltage on the bit line, such as during a sensing operation or during a program voltage. A local bus, LBUS1, allows the sense circuit controller to communicate with components in the sense circuit, such as the latches 550b and the voltage clamp in some cases. To communicate with the sense circuit 550a, the sense circuit controller provides a voltage via a line 502 to a transistor 504 to connect LBUS1 with a data bus DBUS, 503. The communicating can include sending data to the sense circuit and/or receive data from the sense circuit.

The sense circuit controller can communicate with different sense circuits in a time-multiplexed manner, for instance. A line 505 may be connected to the voltage clamp in each sense circuit, in one approach.

The sense circuit 551a includes latches 551b, including a trip latch 546, an offset verify latch 547 and data state latches 548. A voltage clamp 541 may be used to set a pre-charge voltage at a sense node 542. A sense node to bit line (BL) switch 543 selectively allows the sense node to communicate with bit line 545, and a voltage clamp 544 can set a voltage on the bit line. The bit line 545 is connected to one or more memory cells such as a memory cell MC2. A local bus, LBUS2, allows the sense circuit controller to communicate with components in the sense circuit, such as the latches 551b and the voltage clamp in some cases. To communicate with the sense circuit 551a, the sense circuit controller provides a voltage via a line 501 to a transistor 506 to connect LBUS2 with DBUS.

The sense circuit 550a may be a first sense circuit which comprises a first trip latch 526 and the sense circuit 551a may be a second sense circuit which comprises a second trip latch 546.

The sense circuit 550a is an example of a first sense circuit comprising a first sense node 522, where the first sense circuit is associated with a first memory cell MC1 and a first bit line 525. The sense circuit 551a is an example of a second sense circuit comprising a second sense node 542, where the second sense circuit is associated with a second memory cell MC2 and a second bit line 545.

Figure 6A:
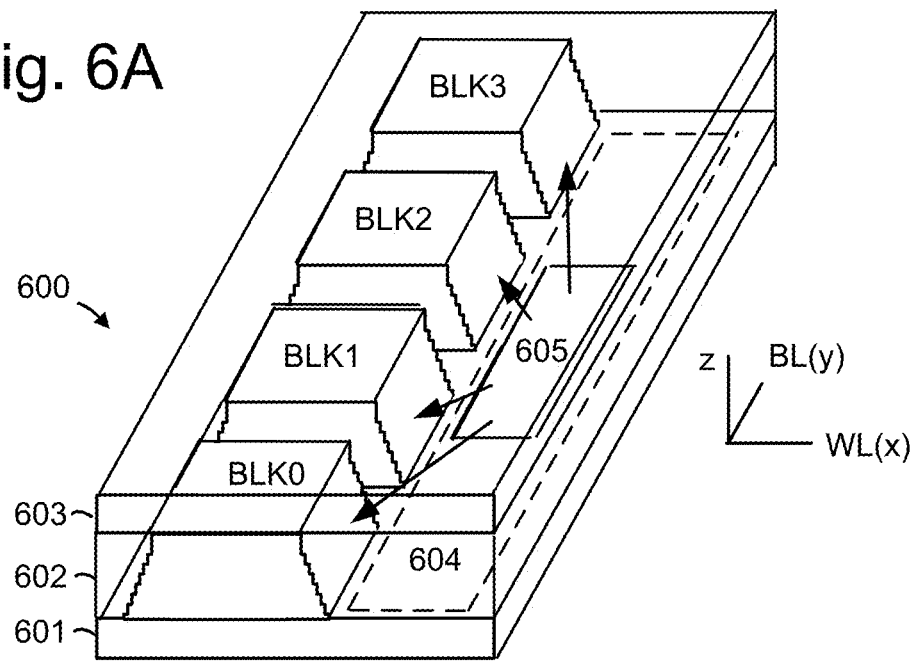
FIG. 6A is a perspective view of a set of blocks in an example three-dimensional configuration of the memory array 126 of FIG. 1.

FIG. 6A is a perspective view of a set of blocks 600 in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
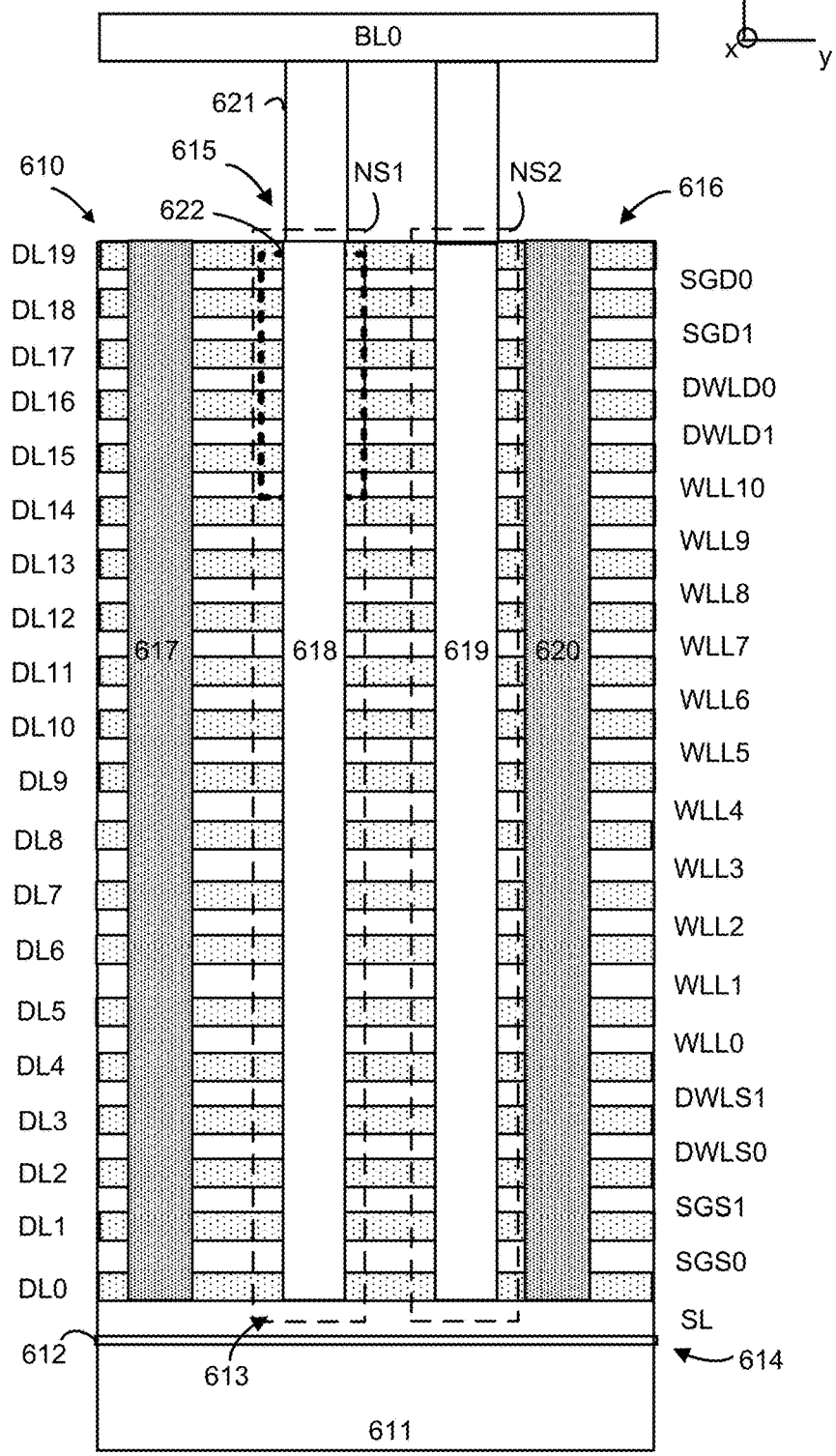
FIG. 6B depicts an example cross-sectional view of a portion of one of the blocks of FIG. 6A.

FIG. 6B depicts an example cross-sectional view of a portion of one of the blocks of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 6C:
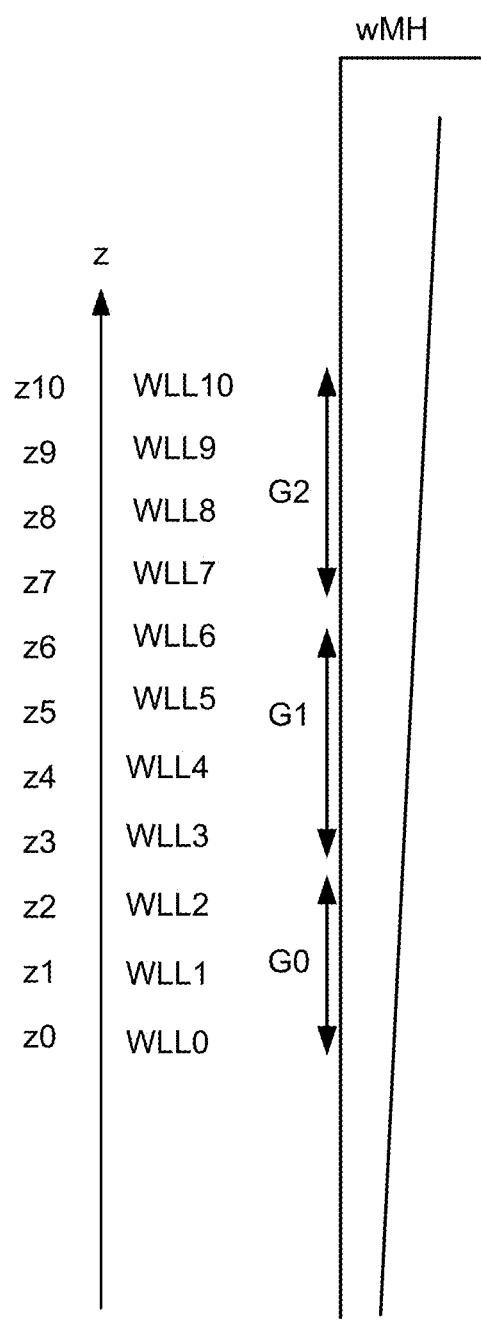
FIG. 6C depicts a plot of memory hole diameter in the stack of FIG. 6B.

FIG. 6C depicts a plot of memory hole diameter in the stack of FIG. 6B. The vertical axis is aligned with the stack of FIG. 6B and depicts a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole.

Due to the non-uniformity in the width of the memory hole, the programming speed, including the program slope (See FIG. 10I) and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes, such as discussed in connection with FIG. 9C. For example, groups G0, G1 and G2 include WLL0-WLL2, WLL3-WLL6 and WLL7-WLL10, respectively.

Figure 6D:
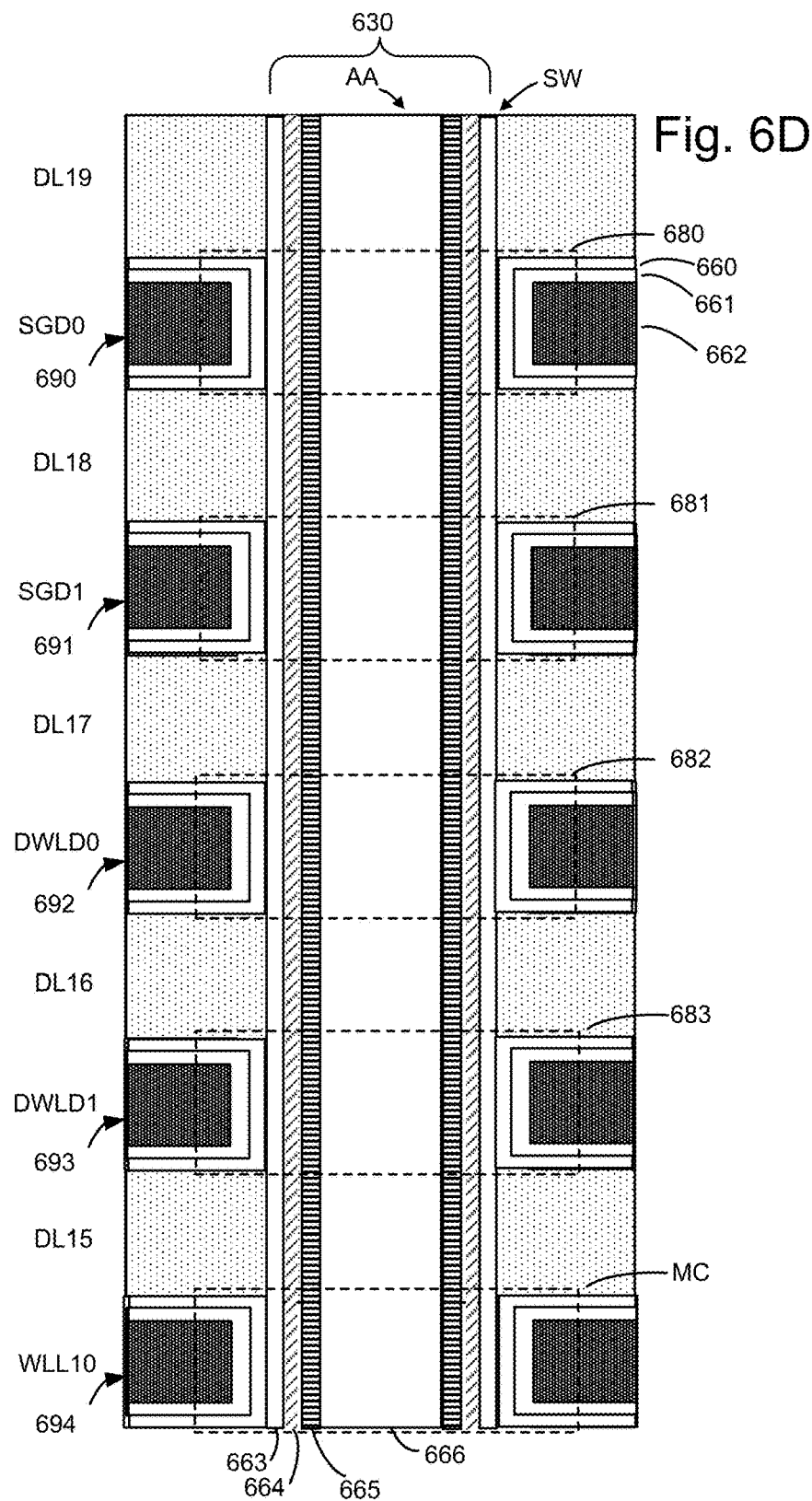
FIG. 6D depicts a close-up view of the region 622 of the stack of FIG. 6B.

FIG. 6D depicts a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figures 7A, 7B:
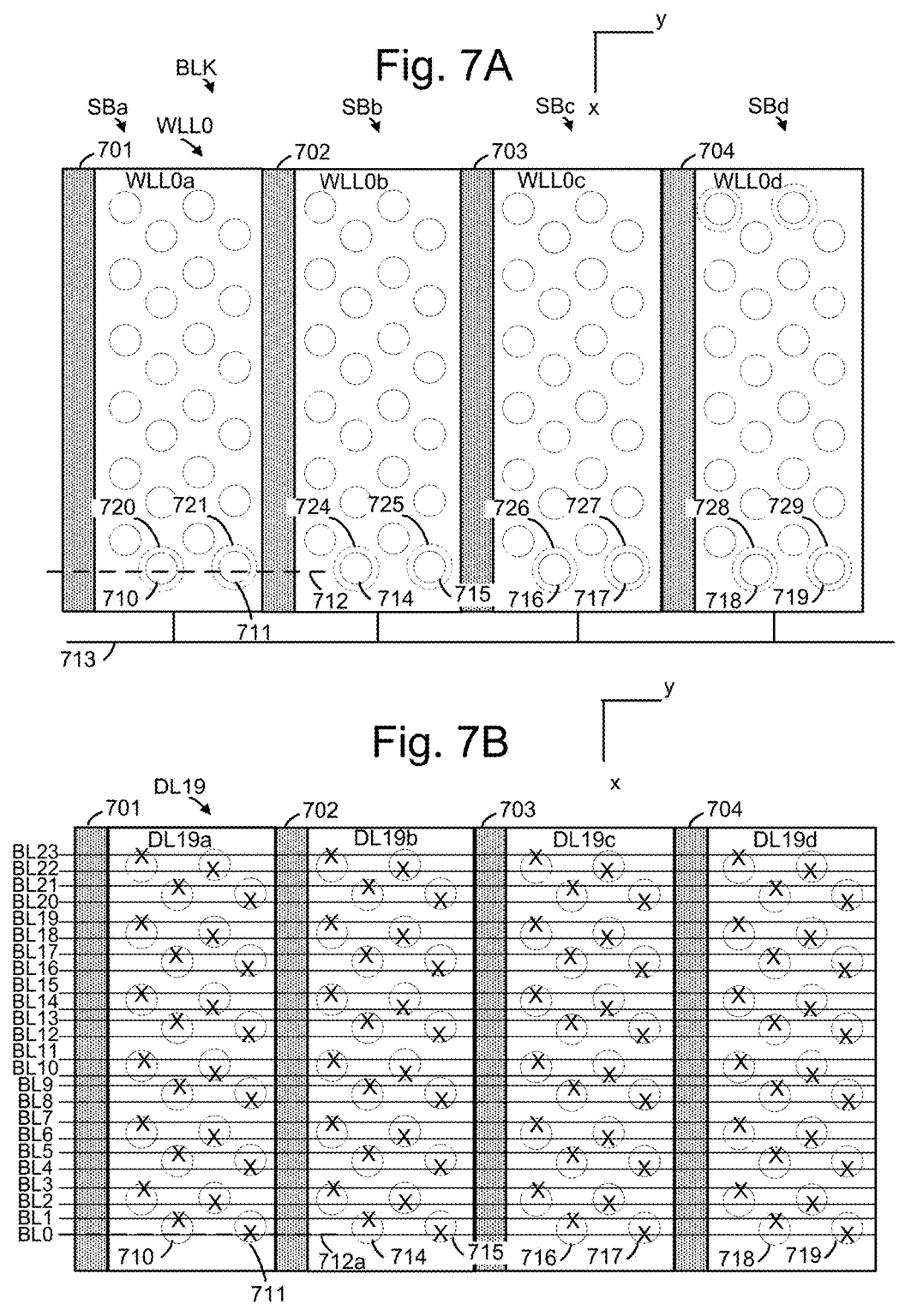

FIG. 7A depicts a top view of an example word line layer WLL0 of the stack of FIG. 6B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block are can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer or word line is divided into regions WLL0a, WLL0b, WLL0c and WLL0d which are each connected by a connector 713. The last region of a word line layer in a block can be connected to a first region of a word line layer in a next block, in one approach. The connector, in turn, is connected to a voltage driver for the word line layer. The region WLL0a has example memory holes 710 and 711 along a line 712. The region WLL0b has example memory holes 714 and 715. The region WLL0c has example memory holes 716 and 717. The region WLL0d has example memory holes 718 and 719. The memory holes are also shown in FIG. 7B. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 720 and 721 are in WLL0a, memory cells 724 and 725 are in WLL0b, memory cells 726 and 727 are in WLL0c, and memory cells 728 and 729 are in WLL0d. These memory cells are at a common height in the stack.

Metal-filled slits 701, 702, 703 and 704 (e.g., metal interconnects) may be located between and adjacent to the edges of the regions WLL0a-WLL0d. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

FIG. 7B depicts a top view of an example top dielectric layer DL19 of the stack of FIG. 6B. The dielectric layer is divided into regions DL19a, DL19b, DL19c and DL19d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19a has the example memory holes 710 and 711 along a line 712a which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL19 layer in the -x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

FIG. 8A depicts example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

At a given height in the block, a set of memory cells in each sub-block are at a common height. For example, one set of memory cells (including the memory cell 804) is among a plurality of memory cells formed along tapered memory holes in a stack of alternating conductive and dielectric layers. The one set of memory cells is at a particular height z0 in the stack. Another set of memory cells (including the memory cell 824) connected to the one word line (WLL0) are also at the particular height. In another approach, the another set of memory cells (e.g., including the memory cell 812) connected to another word line (e.g., WLL8) are at another height (z8) in the stack.

FIG. 8B depicts another example view of NAND strings in sub-blocks. The NAND strings includes NS0_SBa, NS0_SBb, NS0_SBc and NS0_SBd, which have 48 word lines, WL0-WL47, in this example. Each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively. Further, example, groups of word lines G0, G1 and G2 are depicted.

FIG. 9A is a flowchart of an example programming operation in a memory device. Step 900 begins a programming operation for a set of word lines, or for at least one word line. Step 901 selects a word line to program and sets an initial Vpgm. Step 902 performs a program-verify iteration. This includes, at step 909, applying Vpgm to the selected word line, in a programming operation, and applying a verification signal (e.g., a voltage waveform) to the selected word line while performing verify tests, e.g., for one or more data states. Step 910 also includes determining an optimum verify scheme for the word line.

Decision step 903 determines if programming of the word line is done, e.g., based on the results of the verify tests of step 910. The programming may be done, e.g., if all or nearly all of the cells of the word line have been programmed to their assigned data state, that is, the data state they were assigned to represent. If decision step 903 is true, a decision step 906 determines if there is a next word line to program. If decision step 906 is false, the programming operation ends at step 907. If decision step 906 is true, a next word line is selected at step 901. If decision step 903 is false, a decision step 904 determines if a maximum number of program-verify iterations has been performed. If decision step 904 is true, the programming operation fails, at step 908. If decision step 904 is false, Vpgm is stepped up at step 905 and step 902 follows with a next program-verify iteration.

FIG. 9B is a flowchart of an example verify operation consistent with step 910 of FIG. 9A. Step 920 begins verify operations of a program-verify (PV) iteration. Step 921 sets a verification signal for a verify test for state (N). For example, this could include applying a verify voltage to the selected word line. Step 922 performs a verify test of state N for state N cells, e.g., cells assigned to represent state N. There is an option to also perform a verify test of state N for state N+k cells, e.g., cells assigned to represent state N+k. k is an integer, as discussed, such as 1, 2 or 3. For example, at the start of programming, N may be the "1" state in FIG. 15. As a further example, k=2 and N+k=3 (the "3" state in FIG. 15). Step 923 sets a lockout status for state N cells which pass the verify test of state N. When k=2 or more, the another data state (N+k state) is at least two data states higher than the one data state (N state). In another possibility, the another data state has a higher verify voltage than the one data state.

Step 932 obtains a count of state N cells which do not pass the verify test of state N. A decision step 933 determines if the count is less than a $2^{nd}$ threshold, e.g., 1-5% of the state N cells. If decision step 933 is true, the programming is completed for the state N cells at step 934. A decision step 929 determines if there is a verify test for a next state. If decision step 929 is false, step 931 ends the verify operations of the current iteration. If decision step 929 is true, N is incremented at step 930 and step 922 follows with a verify test.

A decision step 924 determines whether to perform a count for the optimized verify scheme. At the start of programming, the verify scheme may designate that the count should be obtained starting in a particular PV iteration. Subsequently, the verify scheme may designate that the count should be obtained starting in a particular PV iteration which is determined adaptively, based on the programming progress as described herein. For example, FIG. 10F provides a chart of PV iteration versus data state, showing which verify tests are performed in which PV iteration, and showing PV iterations in which counting for an optimum verify scheme is performed. If decision step 924 is false, decision step 929 is reached, as discussed previously. If decision step 924 is true, step 925 obtains a count of state N cells and/or state N+k cells which pass the verify test of state N. Note that the counting for the optimized verify scheme is concerned with the upper tail of a Vth distribution, so that a count of cells which pass the verify test and are therefore in the upper tail is of interest. In contrast, the counting for the state N cells at step 932 is concerned with the lower tail of a Vth distribution, so that a count of cells which do not pass the verify test and are therefore in the lower tail is of interest. See also FIG. 10B-10E for further details.

A decision step 926 determines if the count exceeds a first threshold. If decision step 926 is false, decision step 929 follows. If decision step 926 is true, step 927 determines, based on the count, a particular program-verify iteration to perform a verify test of state N+k for state N+k cells based. This could be a PV iteration in which the verify test of state N+k is first performed for the state N+k cells in the programming operation. An initial number of program-verify iterations may have been performed when step 926 is true. Optionally, step 928 determines, based on the count, a PV iteration to count state N+2k cells which pass a verify test of state N+k. This is a program-verify iteration in which to obtain an additional count. The PV iteration determined in step 927 or 928 is stored for future use in the program operation as part of the verify scheme.

This is an example of an apparatus in which one set of memory cells comprises memory cells assigned to represent an additional data state among a plurality of data states, and a determination circuit is configured to determine, based on the amount by which the count exceeds the threshold, a program-verify iteration in which to cause the counting circuit to begin obtaining an additional count of memory cells which pass the verify test for the another data state, and to determine, when the additional count exceeds a respective threshold, and based on an amount by which the additional count exceeds the respective threshold, a program-verify iteration in which to perform a verify test for the additional data state for the memory cells assigned to represent the additional data state.

For example, assume the current PV iteration performs a verify test of state 1 for state 1 cells and state 3 cells. Step 927 determines when to perform a verify test of state 3 for state 3 cells. Step 928 determines when to perform a verify test of state 3 for state 5 cells. Thus, the current verify tests determine whether cells of one data state have completed programming while also optimizing the verify scheme for higher state cells. Also, step 922 perform a verify test of state 1 for state 1 cells. Step 922 can also perform a verify test of state 1 for cells of other states such as state 3 cells. Generally, cells assigned to different states will have similar programming speeds so that their programming progress is similar. Thus, the count of state 1 cells will serve as a good indicator of when to verify the state 3 cells at state 3. However, it is possible that there are program speed variations between the cells assigned to different states. A count of state 3 cells verified at state 1 will therefore serve as a best indicator of when to verify the state 3 cells at state 3.

In some PV iterations, cells assigned to different states will have different programming speeds. For example, cells of one data state may be subject to a slowdown measure when their Vth exceeds a lower verify level but have not reached a lockout level, as in FIG. 11D. In this case, for instance, the count of state 1 cells which are subject to a slowdown measure will not serve as a good indicator of when to verify the state 3 cells at state 3. Instead, the count of state 3 cells verified at state 1 will serve as an accurate indicator of when to verify the state 3 cells at state 3.

A further option is to obtain two or more counts, e.g., a first count of state 1 cells verified at state 1 and a second count of state 3 cells verified at state 1. The PV iteration of step 927 or 928 can be determined separately for each count. If the results differs, one of the results can be selected. A conservative approach is to select the PV iteration among the multiple results which occurs sooner in the programming operation.

Figure 9C:
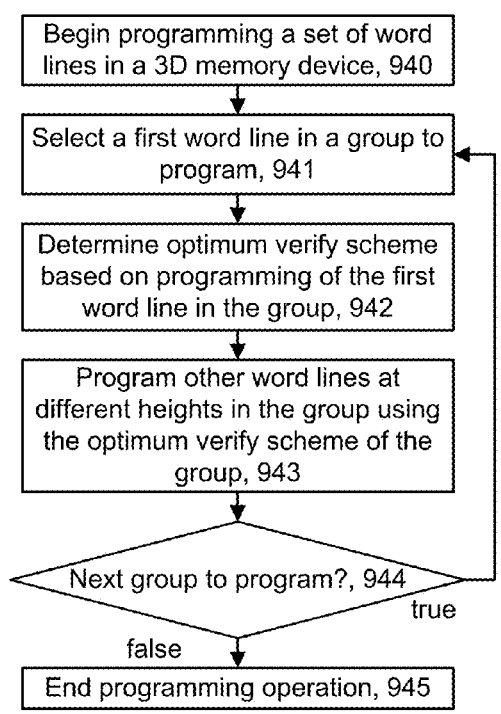
FIG. 9C is a flowchart of an example programming operation which determines an optimum verify scheme for a group of word lines, where the word lines are at different heights in a 3D memory device.

FIG. 9C is a flowchart of an example programming operation which determines an optimum verify scheme for a group of word lines, where the word lines are at different heights in a 3D memory device. Refer also to FIGS. 6C and 8B. Step 940 begins programming of a set of word lines in a 3D memory device. Step 941 selects a first word line in a group to program. For example, this could be WLL0 in G0 in FIG. 6C. Step 942 determines an optimum verify scheme based on programming of the first word line in the group, e.g., in accordance with FIG. 9B. Step 943 programs other word lines, e.g., WLL1 and WLL2 in FIG. 6C, at different heights in the group using the optimum verify scheme of the group. A decision step 944 determines whether there is a next group to program. If decision step 944 is true, the process returns to step 941. If decision step 944 is false, the programming operation ends at step 945. For instance, WLL3 may be the first word line in G1, and WLL7 may be the first word line in G2. The optimum verify scheme of WLL3 may be used in programming WLL4 and WLL5. The optimum verify scheme of WLL7 may be used in programming WLL8, WLL9 and WLL10. This approach saves time because the optimum verify scheme is not determined for each word line. The optimum verify scheme for one word line in a group should be optimum for other word lines in a group that are relatively close together and therefore have a similar memory hole diameter and a correspondingly similar program speed. The optimum verify scheme is re-determined when the memory hole diameter changes significantly.

Figure 9D:
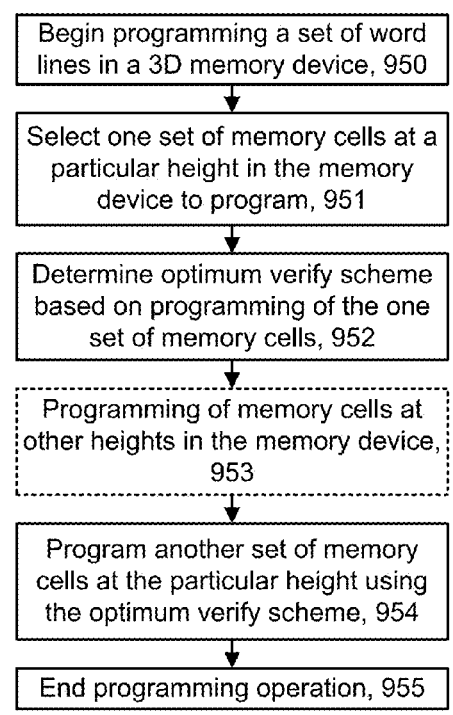
FIG. 9D is a flowchart of an example programming operation which determines an optimum verify scheme for one set of memory cells and applies the optimum verify scheme to another set of memory cells, where both sets are at a common height in a 3D memory device.

FIG. 9D is a flowchart of an example programming operation which determines an optimum verify scheme for one set of memory cells and applies the optimum verify scheme to another set of memory cells, where both sets are at a common height in a 3D memory device. This approach is based on the fast that memory cells which are at a common height in a stack will have a similar memory hole diameter and a correspondingly similar program speed. This approach saves time because the optimum verify scheme is not determined for different sets of memory cells connected to a common word line. The different sets of memory cells can be in different sub-blocks, for example.

Step 950 begins programming of a set of word lines in a 3D memory device. Step 951 selects one set of memory cells at a particular height in the memory device to program, e.g., memory cells of a particular word line layer. Step 952 determines an optimum verify scheme based on programming of the one set of memory cells, e.g., in accordance with FIG. 9B. Step 953 includes optional programming of memory cells at other heights or word line layers in the memory device. Step 954 includes programming another set of memory cells at the particular height using the optimum verify scheme. Step 955 ends the programming operation, or additional memory cells can be programmed.

Figure 9E:
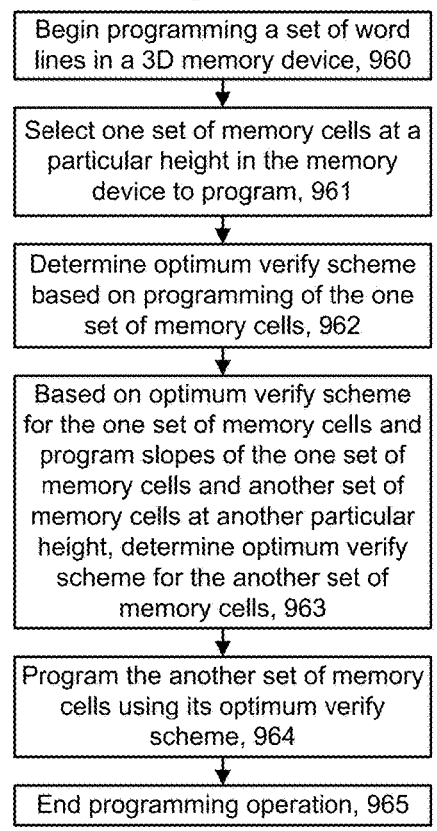
FIG. 9E is a flowchart of an example programming operation which determines an optimum verify scheme for one set of memory cells and applies the optimum verify scheme to another set of memory cells, where the sets are at different heights in a 3D memory device.

FIG. 9E is a flowchart of an example programming operation which determines an optimum verify scheme for one set of memory cells and applies the optimum verify scheme to another set of memory cells, where the sets are at different heights in a 3D memory device. Refer also to FIG. 10I. Step 960 begins programming of a set of word lines in a 3D memory device. Step 961 selects one set of memory cells at a particular height (e.g., in a particular word line such as WL0) in the memory device to program. Step 962 determines an optimum verify scheme based on programming of the one set of memory cells. Step 963 includes, based on the optimum verify scheme for the one set of memory cells and program slopes of the one set of memory cells and another set of memory cells at another particular height (e.g., in another word line such as WL40), determine an optimum verify scheme for the another set of memory cells. The program slopes may be determined from testing, for example. In FIG. 10I, the program slope is 0.83 V/V for WL0 and 0.75 V/V for WL40. Step 964 includes programming the another set of memory cells using its optimum verify scheme. Step 965 ends the programming operation, or other memory cells may be programmed.

As an example, consider the PV iteration determined in step 927 of FIG. 9B during step 963 from WL40. Assume, in a 20th V iteration, step 927 determines that the PV iteration to perform the verify test of state N+k for state N+k cells is the 22nd PV iteration. At this point, 20 program pulses of magnitude (step size) 0.2 V, for instance have been applied. For WL0, at the 22nd PV iteration, the Vth of the cells is expected to be 22×0.2×0.83=3.65 V, assuming a starting Vth of 0 V. For WL40, the Vth of the cells is expected to reach 3.65 V at 3.65/(0.2×0.75)=24 PV iterations. The verify scheme of WL40 can therefore be set to perform the verify test of state N+k for state N+k cells at the 24th PV iteration. The adjustment is therefore based on step size and program slope.

This is an example of an apparatus in which a determination circuit is configured to determine, based on the count and a difference between a program slope of the one set of memory cells and a program slope of the another set of memory cells, a particular program-verify iteration in which to perform the verify test for memory cells in the another set of memory cells which are assigned to represent the another data state (N+k state).

Figure 10A:
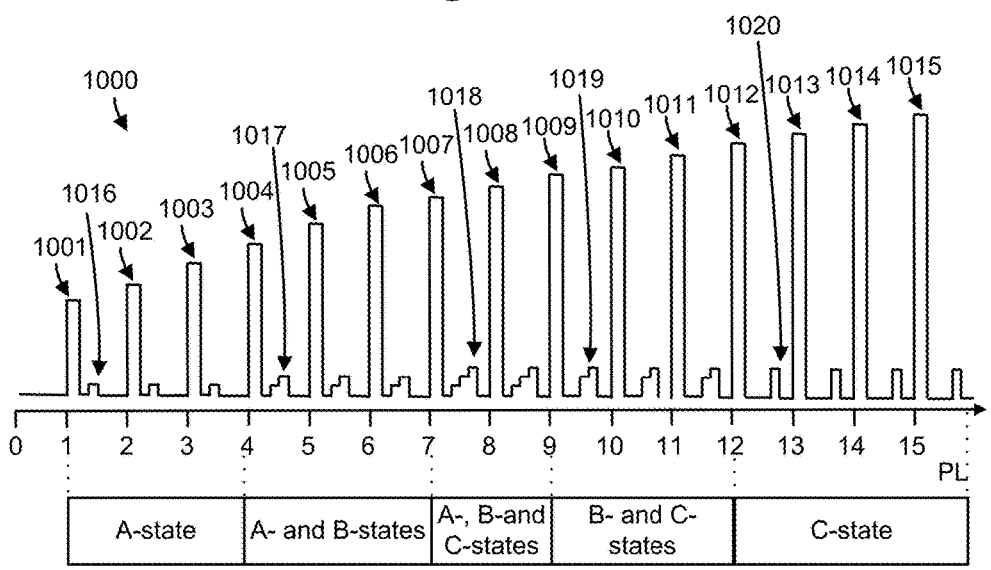
FIG. 10A depicts a waveform of an example programming operation, consistent with FIGS. 9A and 9B.

FIG. 10A depicts a waveform of an example programming operation, consistent with FIGS. 9A and 9B. The horizontal axis depicts a program loop number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

For each program voltage, a square waveform is depicted for simplicity, although other shapes are possible such as a multilevel shape or a ramped shape. Further, Incremental Step Pulse Programming (ISPP) is used in this example, in which the program voltage steps up in each successive program loop. This example uses ISPP in a single programming pass in which the programming is completed. ISPP can also be used in each programming pass of a multi-pass operation.

A pulse train typically includes program voltages which increase stepwise in amplitude in each program-verify iteration using a fixed of varying step size. A new pulse train can be applied in each programming pass of a multi-pass programming operation, starting at an initial Vpgm level and ending at a final Vpgm level which does not exceed a maximum allowed level. The initial Vpgm levels can be the same or different in different programming passes. The final Vpgm levels can also be the same or different in different programming passes. The step size can be the same or different in the different programming passes. In some cases, a smaller step size is used in a final programming pass to reduce Vth distribution widths.

The pulse train 1000 includes a series of program voltages 1001, 1002, 1003, 1004, 1005, 1006, 1007, 1008, 1009, 1010, 1011, 1012, 1013, 1014 and 1015 that are applied to a word line selected for programming, and an associated set of non-volatile memory cells. One, two or three verify voltages are provided after each program voltage as an example, based on the target data states which are being verified. 0 V may be applied to the selected word line between the program and verify voltages. For example, an A-state verify voltage of VvA (e.g., waveform or programming signal 1016) may be applied after each of the first, second and third program voltages 1001, 1002 and 1003, respectively. A- and B-state verify voltages of VvA and VvB (e.g., programming signal 1017) may be applied after each of the fourth, fifth and sixth program voltages 1004, 1005 and 1006, respectively. A-, B- and C-state verify voltages of VvA, VvB and VvC (e.g., programming signal 1018) may be applied after each of the seventh and eighth program voltages 1007 and 1008, respectively. B- and C-state verify voltages of VvB and VvC (e.g., programming signal 1019) may be applied after each of the ninth, tenth and eleventh program voltages 1009, 1010 and 1011, respectively. Finally, a C-state verify voltage of VvC (e.g., programming signal 1020) may be applied after each of the twelfth, thirteenth, fourteenth and fifteenth program voltages 1012, 1013, 1014 and 1015, respectively.

In FIG. 10B-10E, the vertical axis depicts a number of memory cells on a log scale and the horizontal axis depicts Vth. VvN is the verify voltage of an Nth state, and VvN+k is the verify voltage of an N+kth state.

Figure 10B:
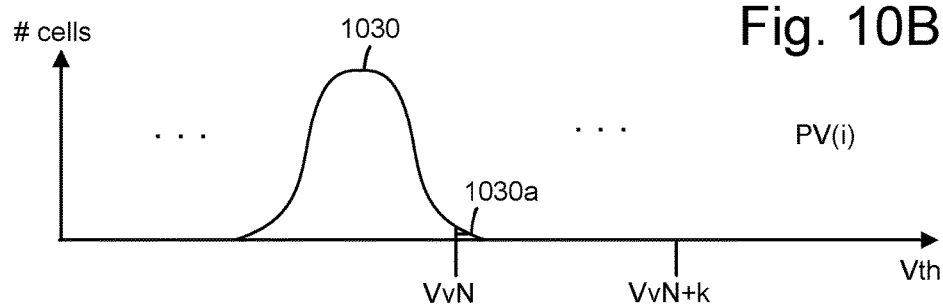
FIG. 10B depicts an example Vth distribution of cells which are subject to a verify test of state N in PV(i), an ith program-verify iteration.

FIG. 10B depicts an example Vth distribution 1030 of cells which are subject to a verify test of state N in PV(i), an ith program-verify iteration. At this time, a small portion 1030a of the upper tail of the Vth distribution has exceeded VvN. Assume this count is less than the threshold of FIG. 10J.

Figure 10C:
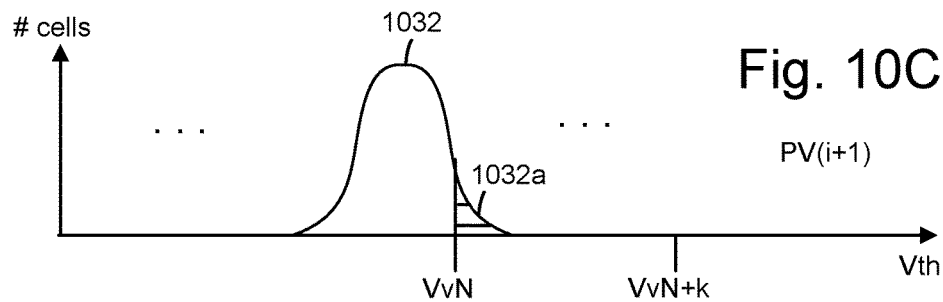
FIG. 10C depicts an example Vth distribution of cells which are subject to a verify test of state N in PV(i+1).

FIG. 10C depicts an example Vth distribution 1032 of cells which are subject to a verify test of state N in PV(i+1). At this time, a larger portion 1032a of the upper tail of the Vth distribution has exceeded VvN. Assume this count exceeds the threshold of FIG. 10J. This result in step 926 being true in FIG. 9B (count>$1^{st}$ threshold). As a result, a count for the upper tail is no longer need for the Vth distribution at state N. Instead, a count of the lower tail of the Vth is relevant.

Figure 10D:
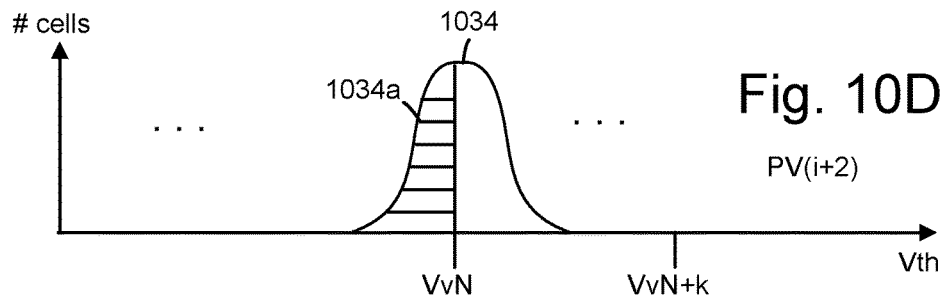
FIG. 10D depicts an example Vth distribution of cells which are subject to a verify test of state N in PV(i+2).

FIG. 10D depicts an example Vth distribution 1034 of cells which are subject to a verify test of state N in PV(i+2). At this time, a large portion 1034a of the lower tail of the Vth distribution does not exceed VvN.

Figure 10E:
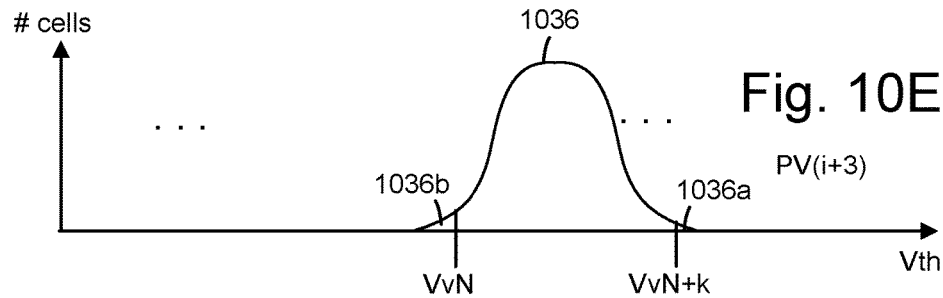
FIG. 10E depicts an example Vth distribution of cells which are subject to a verify test of state N and state N+k in PV(i+3).
Figure 10F:
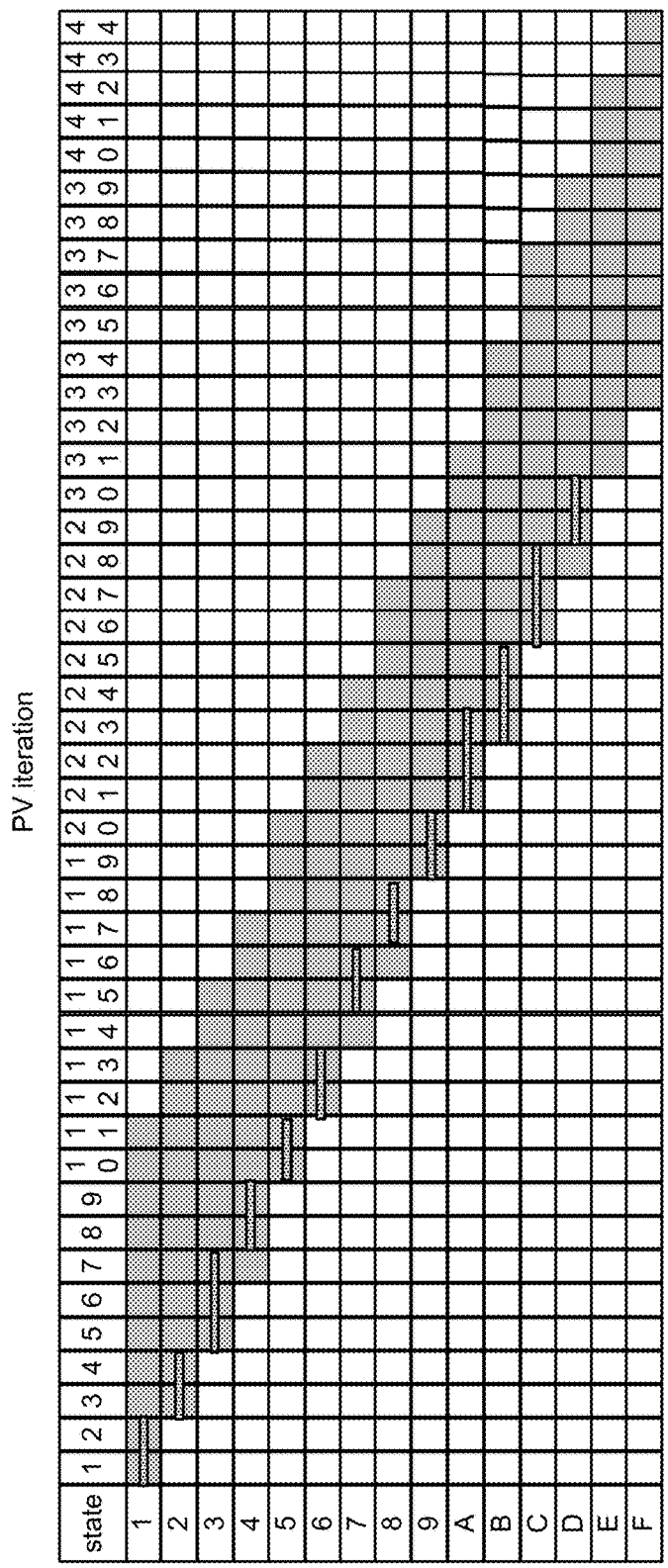
FIG. 10F depicts a chart of PV iteration versus data state, showing which verify tests are performed in which PV iteration, and showing PV iterations in which counting for an optimum verify scheme is performed, for a set of memory cells with an average program slope.

FIG. 10E depicts an example Vth distribution 1036 of cells which are subject to a verify test of state N and state N+k in PV(i+3). At this time, a small portion 1036b of the lower tail of the Vth distribution does not exceed VvN. This may result in step 933 being true in FIG. 9B (count<$2^{nd}$ threshold). Also at this time, a small portion 1036a of the upper tail of the Vth distribution exceeds VvN+k.

In FIG. 10E-10H, the PV iteration extends in the horizontal direction and the state extends in the vertical direction. For each PV iteration, each shaded square represents the case where a verify test is performed for a corresponding state.

FIG. 10F depicts a chart of PV iteration versus data state, showing which verify tests are performed in which PV iteration, and showing PV iterations in which counting for an optimum verify scheme is performed, for a set of memory cells with an average program slope. 44 PV iterations are used in the programming operation. For example, a verify test is performed for state 1 in PV1-11, while counting is performed in PV1 and PV2. A horizontal bar represents the PV iterations in which counting occurs for the optimum verify scheme. Generally, the counting occurs on or after the first PV iteration in which the verify test is performed for a given state. The counting occurs on the first PV iteration in which the verify test is performed for states 1, 2, 3, 5, 6, 9, A, B and C. The counting occurs on the second PV iteration in which the verify test is performed for states 4, 7, 8 and D. Further, the counting is performed for 2 consecutive PV iterations for states 1, 2, 4-9 and D. The counting is performed for 3 consecutive PV iterations for states 3, A, B and C. The counting, in general, consumes a small portion of the PV iterations for each state. In this example, k=2 so that the last counting for the verify scheme is for state D, to determine when to verify state F.

Figure 10G:
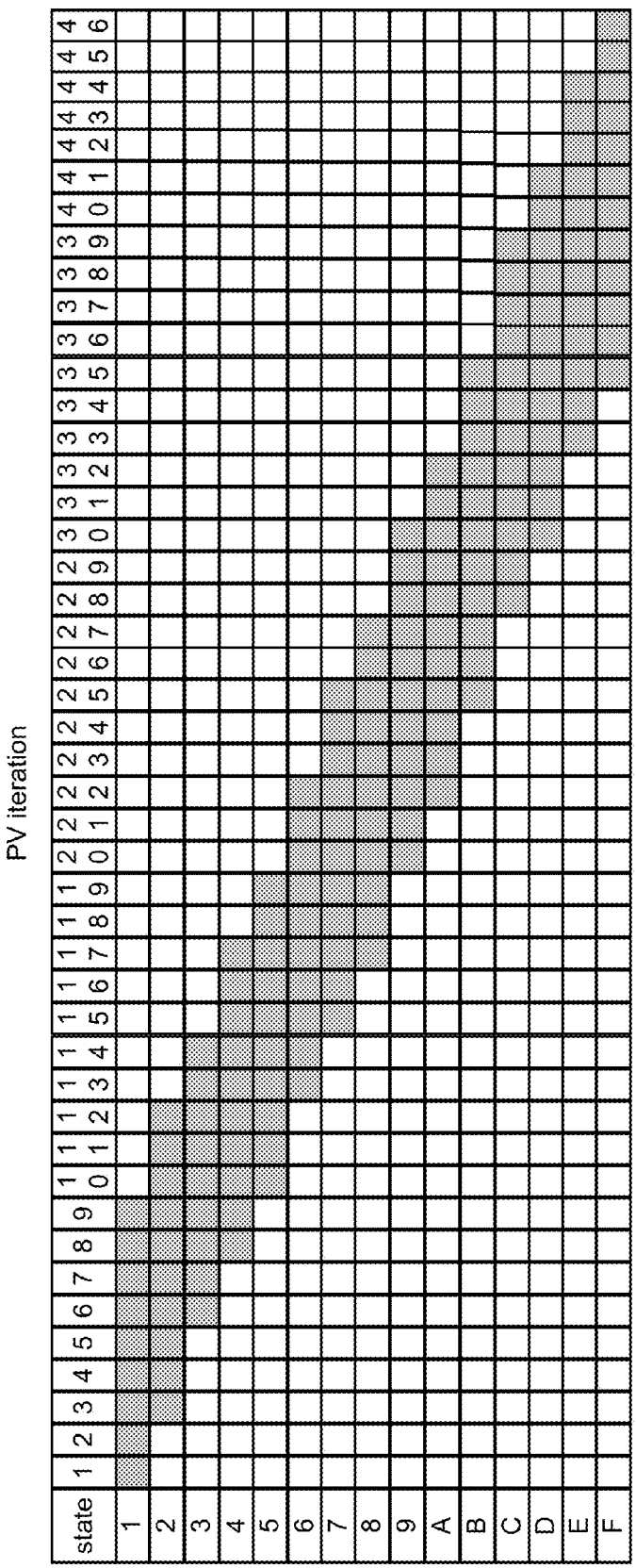
FIG. 10G depicts a chart of PV iteration versus data state, showing which verify tests are performed in which PV iteration, for a set of memory cells with a low program slope.

FIG. 10G depicts a chart of PV iteration versus data state, showing which verify tests are performed in which PV iteration, for a set of memory cells with a low program slope. Due to the lower program slope, 46 PV iterations are used in the programming operation.

Figure 10H:
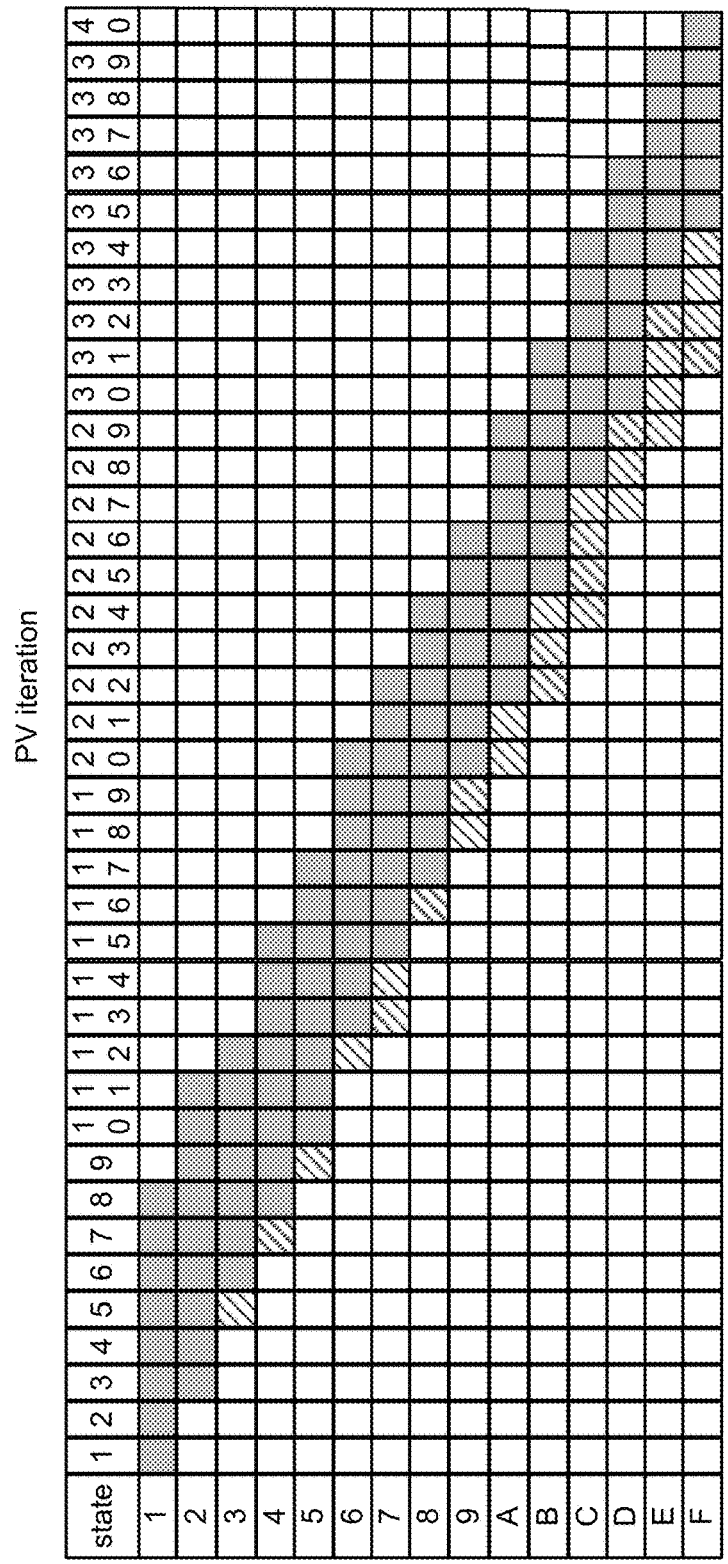
FIG. 10H depicts a chart of PV iteration versus data state, showing which verify tests are performed in which PV iteration, for a set of memory cells with a high program slope.
Figure 10I:
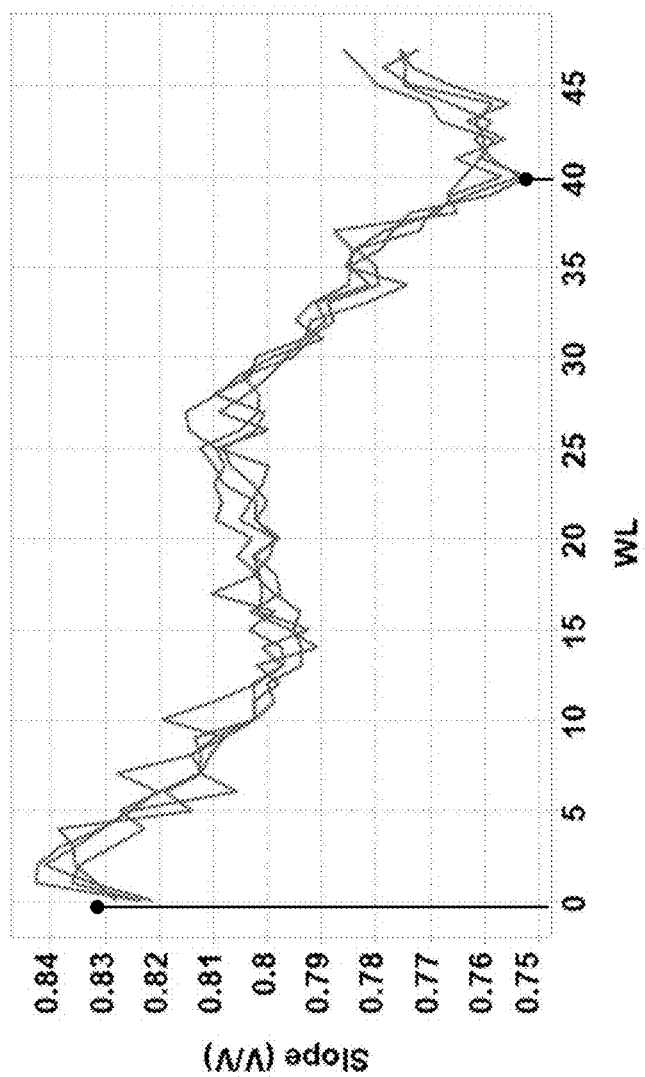
FIG. 10I depicts a plot of program slope versus word line for a 3D memory device in which the word lines are at different heights.

FIG. 10H depicts a chart of PV iteration versus data state, showing which verify tests are performed in which PV iteration, for a set of memory cells with a high program slope. 40 PV iterations are used in the programming operation. Some of the boxes have a diagonal lined pattern to represent unnecessary verify tests for memory cells with the lower program slope of FIG. 10G. There are several unnecessary verify tests which would be performed if the verify scheme of FIG. 10H was used for the memory cells of FIG. 10G. This demonstrates the importance of optimizing the verify scheme for a set of memory cells.

Figure 10J:
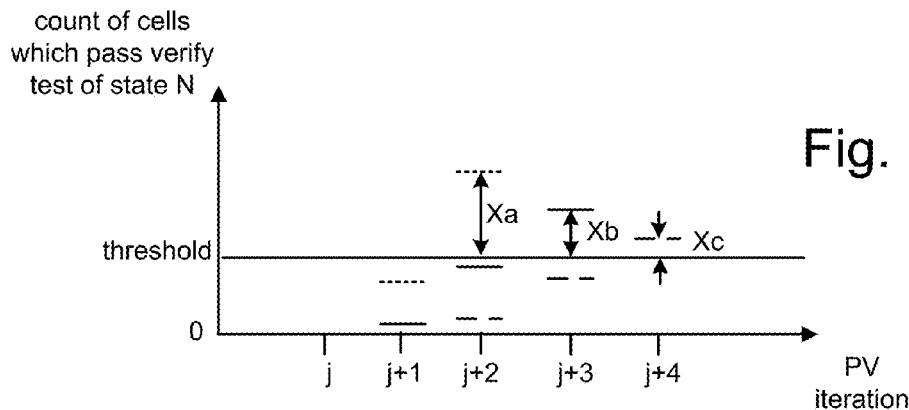
FIG. 10J depicts a plot of a count of memory cells which pass a verify test of state N, versus PV iteration, for memory cells with a low, medium and high program slope.

FIG. 10I depicts a plot of program slope versus word line for a 3D memory device in which the word lines are at different heights. Each line is from a different sub-block in a block. The program slope decreases toward the top of the stack, where the memory hole is wider due to the weaker electric field. However, the variation between word lines is non-systematic FIG. 10J depicts a plot of a count of memory cells which pass a verify test of state N, versus PV iteration, for memory cells with a low, medium and high program slope. The threshold corresponds to the first threshold of step 926 of FIG. 9B. The threshold is a threshold number of memory cells which pass a verify test of one data state (e.g., N state). The low program slope is represented by long dashed lines. The count is below the threshold at PV(j)-PV(j+3) and exceeds the threshold by a number Xc cells at PV(j+4). The medium program slope is represented by solid lines. The count is below the threshold at PV(j)-PV(j+2) and exceeds the threshold by a number Xb cells at PV(j+3). The high program slope is represented by dotted lines. The count is below the threshold at PV(j) and PV(j+1) and exceeds the threshold by a number Xa cells at PV(j+2). In this example, Xa>Xb>Xc. This shows that faster programming cells will typically exceed the threshold by a larger amount. The threshold, e.g., a bit ignore level, can be configured for the memory device as a whole or optimized for each word line.

This is an example of an apparatus in which a counting circuit is configured to make the determination that the count exceeds the bit ignore level in a program-verify iteration which is at least one program-verify iteration before a particular program-verify iteration in a programming operation.

Figure 10K:
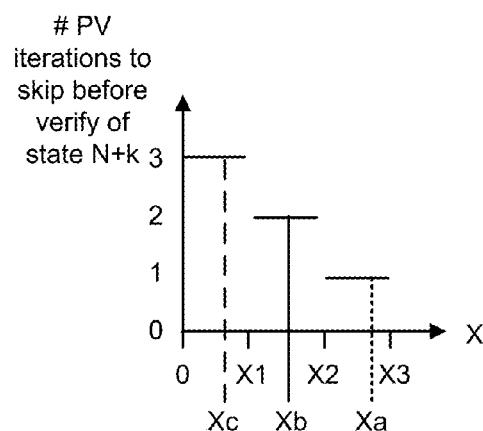
FIG. 10K depicts a plot of a number of PV iterations to skip before a verify of state N+k, versus X, an amount which the count of FIG. 10J exceeds a threshold.

FIG. 10K depicts a plot of a number of PV iterations to skip before a verify of state N+k, versus X, an amount which the count of FIG. 10J exceeds a threshold. For example this can be used in step 927 of FIG. 9B. When X is relatively larger, the number of PV iterations to skip is relatively smaller and the verify of state N+k occurs relatively sooner in the programming operation. For instance, consistent with FIG. 10J, X=Xc, Xb or Xa results in three, two or one PV iterations being skipped. The number of PV iterations to skip is based on a range of value in which X falls, e.g., three skips if 0<X<=X1, two skips if X1<X<=X2 and one skip if X2<X<=X3.

This is an example of an apparatus in which a number of program-verify iterations between a program-verify iteration in which the counting circuit is configured to obtain the count and the particular program-verify iteration, is a first positive number when the count is in a first range of values; and the number of program-verify iterations between the program-verify iteration in which the counting circuit is configured to obtain the count and the particular program-verify iteration is a second positive number, higher than the first positive number, when the count is in a second range of values lower than the first range of values.

Figure 10L:
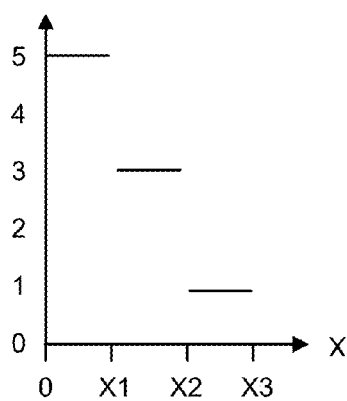
FIG. 10L depicts a plot of a number of PV iterations to skip before counting N+2k state cells which pass a verify test of state N+k, versus X, an amount which the count of FIG. 10J exceeds a threshold.

FIG. 10L depicts a plot of a number of PV iterations to skip before counting N+2k state cells which pass a verify test of state N+k, versus X, an amount which the count of FIG. 10J exceeds a threshold. For example this can be used in step 928 of FIG. 9B. When X is relatively larger, the number of PV iterations to skip is relatively smaller and the counting of the N+2k state cells occurs relatively sooner in the programming operation. For instance, consistent with FIG. 10J, X=Xc, Xb or Xa results in five, three or one PV iterations being skipped. The number of skips in FIG. 10L is the same as in FIG. 10K for the larger value of X. However, the number of skips in FIG. 10L is larger than in FIG. 10K for the medium and smaller values of X. Further, the amount by which the number of skips is larger in FIG. 10L than in FIG. 10K is progressively large as X is progressively smaller. This approach recognizes that the PV iteration for beginning to count can be different than, and greater than, the PV iteration for performing a verify test. This provides flexibility to eliminate some counting operations to further save time.

FIGS. 11A and 11B depict Vth distributions of memory cells in an example one-pass programming operation with four data states, consistent with FIG. 9A. In this example, the memory cells are initially in the erased state (bits 11) as represented by the Vth distribution 1100. Subsequently, the programming causes the Vth of the A, B and C state cells to reach the Vth distributions 1102, 1104 and 1106, respectively. A small number of A, B and C state cells may have a Vth which is below VvA, VvB or VvC, respectively, due to a bit ignore criteria.

FIG. 11C depicts Vth distributions of memory cells after a first pass (a foggy pass) and a second pass (a fine pass) of an example two-pass programming operation with four data states, consistent with FIG. 9A. In this example, the first programming pass causes the Vth of the A, B and C state cells to reach the Vth distributions 1102a, 1104a and 1106a, respectively, using verify voltages of VvAf, VvBf and VvCf, respectively. This first pass can be a rough programming which uses a relatively large step size, for instance, so that the Vth distributions 1102a, 1104a and 1106a are relatively wide. The second pass may use a smaller step size and causes the Vth distributions 1102a, 1104a and 1106a to transition to the final Vth distributions 1102, 1104 and 1106, respectively, which are relatively narrow. This two-pass programming operation can achieve relatively narrow Vth distributions.

FIG. 11D depicts Vth distributions of memory cells in a one-pass programming operation which uses a slowdown measure. During a programming operation, when the Vth of a cell is close to the final verify voltage, the programming speed of the cell can be slowed down. For example, when the Vth of an A, B or C state cell exceeds VvAL, VvBL or VvCL, respectively, the programming speed can be slowed by raising an associated bit line voltage to an intermediate level, between 0 V and a lockout level, during the subsequent programming voltages. Once the A, B or C state cell exceeds the final verify voltage of VvA, VvB or VvC, respectively, the cell can be locked out from further programming by raising the associated bit line voltage to a lockout voltage during subsequent programming voltages. The zones between VvAL and VvA, VvBL and VvB, and VvCL and VvC, represent zones in which the slow programming is used for the A, B and C state cells, respectively.

Figure 12A:
FIG. 12A to 12C depict Vth distributions of memory cells in a two-pass programming operation with four data states, consistent with FIG. 9A.
Figure 12B:
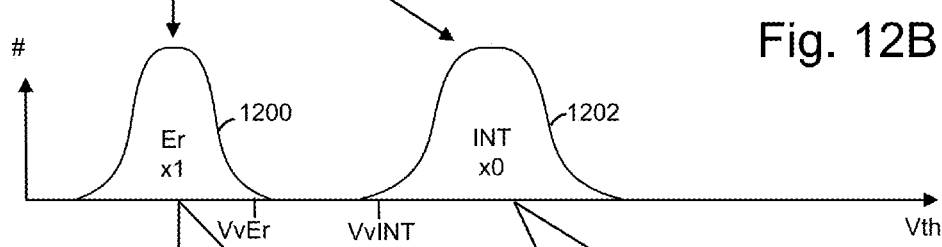
Figure 12C:
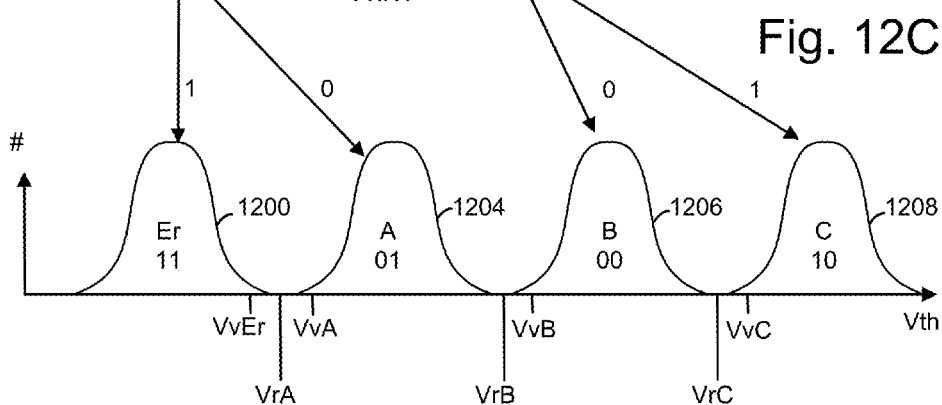

FIG. 12A to 12C depict Vth distributions of memory cells in a two-pass programming operation with four data states, consistent with FIG. 9A. Each pass can be used to program a page of data. For example, programming of lower and upper pages in two-bit, four-level memory cells is provided. Programming can be performed one logical page at a time, with the lower page followed by the upper page. Initially, all memory cells are in the erased (Er) state, represented by the Vth distribution 1200.

FIG. 12B depicts programming of a lower page of data. If the lower page has a bit=1, the associated memory cell remains in the Vth distribution 1200 and the data is represented by x1, where x is an upper page bit that is not yet known. If the lower page has a bit=0, the memory cell is programmed to a higher Vth as represented by distribution 1202, which is an interim distribution (INT), using a verify voltage VvINT. The data of these memory cells is represented by x0. Note that the interim distribution can be relatively wide since it is not a final distribution and does not represent a final data state.

FIG. 12C depicts programming of an upper page of data. If UP/LP=11, the associated memory cell in the Vth distribution 1200 remains in the Vth distribution 1200 and stores data bits 11. If UP/LP=01, the memory cells in the Vth distribution 1200 are programmed to the Vth distribution 1204. If UP/LP=10, the memory cells in the Vth distribution 1202 are programmed to the Vth distribution 1208. If UP/LP=00, the memory cells in the Vth distribution 1202 are programmed to the Vth distribution 1206. The example read levels and program-verify voltages discussed previously are also depicted. Programming can be similarly extended to three or more bits per memory cell.

FIG. 13A to 13D depict Vth distributions of memory cells in a three-pass programming operation with eight data states, consistent with FIG. 9A. Programming of lower, middle and upper pages in three-bit, eight-level memory cells is depicted. Seven programmed data states A through G are used in addition to Er for eight states total. Initially, all memory cells are in the Er state, represented by the Vth distribution 1300. The lower page (LP) is programmed in FIG. 13B. If LP=1, memory cells in distribution 1300 remain in that distribution. If LP=0, memory cells in distribution 1300 are programmed to an interim distribution 1302 using Vv1. The middle page is programmed in FIG. 13C. If MP=1, memory cells in distribution 1300 remain in that distribution, and memory cells in distribution 1302 are programmed to interim distribution 1308 using verify voltage Vv4. If MP=0, memory cells in distribution 1300 are programmed to interim distribution 1304 using verify voltage Vv2, and memory cells in distribution 1302 are programmed to interim distribution 1306 using verify voltage Vv3.

The upper page (UP) is programmed in FIG. 13D. If UP=1, memory cells in distribution 1300 remain in that distribution, memory cells in distribution 1304, 1306 or 1308 are programmed to distribution 1314 (state C), distribution 1316 (state D), or distribution 1322 (state G), respectively.

If UP=0, memory cells in distribution 1300, 1304, 1306 or 1308 are programmed to distribution 1310 (state A), distribution 1312 (state B), distribution 1318 (state E) and distribution 1320 (state F), respectively. Programming using four bits per cell (16 levels) can similarly involve four pages.

FIG. 14A to 14C depict Vth distributions of memory cells in a two-pass programming operation with eight data states, consistent with FIG. 9A. This example differs from FIG. 13A-13D in that one less programming pass is used. Initially, all memory cells are in the Er state, represented by the Vth distribution 1400. The lower page is programmed in FIG. 14B. If LP=1, memory cells in distribution 1400 remain in that distribution. If LP=0, memory cells in distribution 1400 are programmed to an interim distribution 1402 using Vv1. The middle and upper pages are programmed together in FIG. 14C. If UP/MP=11, memory cells in distribution 1400 remain in that distribution. If UP/MP=01, 00 or 10, memory cells in distribution 1400 are programmed to final Vth distributions 1410, 1412 and 1414, respectively. If UP/MP=10, 00, 01 or 11, memory cells in the Vth distribution 1402 are programmed to final Vth distributions 1416, 1418, 1420 and 1422, respectively.

FIG. 15 depicts a threshold voltage (Vth) distribution of a set of memory cells along with verify voltages, where there are sixteen data states. A first Vth distribution 1500 is provided for erased (Er) state memory cells. Vth distributions 1501, 1502, 1503, 1504, 1505, 1506, 1507, 1508, 1509, 1510, 1511, 1512, 1513, 1514 and 1515 represent data states 1, 2, 3, 4, 5, 6, 7, 8, 9, 10, A, B, C, D, E and F, respectively, which are reached by memory cells when their Vth exceeds the final verify voltage VvA1 Vv2, Vv3, Vv4, Vv5, Vv6, Vv7, Vv8, Vv9, VvA, VvB, VvC, VvD, VvE and VvF, respectively. In this example, the data states do not have offset verify voltages. However, it is possible to provide such offset verify voltages in a manner analogous to FIG. 11D.

Accordingly, it can be seen that, in one embodiment, an apparatus comprises: one set of memory cells connected to one word line; a programming circuit configured to perform a programming operation for the one set of memory cells, wherein: the one set of memory cells comprises memory cells assigned to represent one data state among a plurality of data states and memory cells assigned to represent another data state among the plurality of data states; the programming operation comprising a plurality of program-verify iterations; and in each program-verify iteration, the programming circuit performs programming for the one word line after which the programming circuit applies a verification signal to the one word line; a counting circuit configured to obtain a count of memory cells which pass a verify test for the one data state; and a determination circuit configured to determine, based on an amount by which the count exceeds a threshold, a particular program-verify iteration among the plurality of program-verify iterations in which to perform a verify test for the another data state for the memory cells assigned to represent the another data state.

In another embodiment, a method comprises: performing an initial number of program-verify iterations in a programming operation for a set of memory cells, the memory cells comprise memory cells assigned to one data state among a plurality of data states and memory cells assigned to another data state among the plurality of data states; during one or more program-verify iterations of the initial number of program-verify iterations, obtaining a count of memory cells which pass a verify test of the one data state and determining that the count exceeds a threshold; in response to the obtaining the count and the determining that the count exceeds the threshold, classifying the count into a particular range of values among a plurality of ranges of values; and determining, based on the particular range of values, a particular program-verify iteration of the programming operation in which to begin to subject the memory cells assigned to the another data state to a verify test of the another data state.

In another embodiment, a memory device comprises means for performing each of the steps in the above-mentioned method.

In another embodiment, an apparatus comprises: a set of memory cells; and a control circuit. The control circuit is configured to: perform a programming operation for the set of memory cells, the programming operation comprising a plurality of program-verify iterations; determine a particular program-verify iteration among in which a threshold number of memory cells pass a verify test of one data state; and determine when in the programming operation to begin to perform a verify test of another data state for a subset of the memory cells assigned to represent the another data state, wherein the verify test begins in a program-verify iteration of the programming operation which is a particular number of program-verify iterations after the particular program-verify iteration, and the particular number is a function of the number of the memory cells.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
one set of memory cells connected to one word line;
a programming circuit configured to perform a programming operation for the one set of memory cells, wherein:
the one set of memory cells comprises memory cells assigned to represent a first data state among a plurality of data states and memory cells assigned to represent a second data state among the plurality of data states;
the programming operation comprising a plurality of program-verify iterations; and
in each program-verify iteration, the programming circuit performs programming for the one word line after which the programming circuit applies a verification signal to the one word line;
a counting circuit configured to obtain a count of one or more memory cells which pass a verify test for the first data state, the programming circuit configured to perform a number of program-verify iterations in which a verify test for the second data state is skipped, then perform a program-verify iteration in which the verify test for the second data state is performed for the memory cells assigned to represent the second data state, wherein the number is one or more and is a function of the count.

2. The apparatus of claim 1, wherein:
the determination circuit configured to determine the number of program-verify iterations to skip in response to a determination that the count exceeds a bit ignore level.

3. The apparatus of claim 1, wherein:
the counting circuit configured to obtain the count as a count of memory cells having a sensed threshold voltage above a verify voltage for the first data state.

4. The apparatus of claim 1, wherein:
the verify test for the second data state is a first verify test for the second data state in the programming operation.

5. The apparatus of claim 1, wherein:
the memory cells which pass the verify test of the first data state comprise some of the memory cells assigned to represent the first data state and some of the memory cells assigned to represent the second data state.

6. The apparatus of claim 1, wherein:
the one set of memory cells comprises memory cells assigned to represent a third data state among the plurality of data states; and
the determination circuit configured to determine, based on the count, a program-verify iteration in which to cause the counting circuit to begin obtaining an additional count of memory cells which pass the verify test for the second data state, and to determine, when the additional count exceeds a respective threshold, and based on an amount by which the additional count exceeds the respective threshold, a program-verify iteration in which to perform a verify test for the third data state for the memory cells assigned to represent the third data state.

7. The apparatus of claim 6, wherein:
the memory cells which pass the verify test of the second data state comprise some of the memory cells assigned to represent the third data state.

8. The apparatus of claim 4, wherein:
the one set of memory cells is among a plurality of memory cells formed along tapered memory holes in a stack of alternating conductive and dielectric layers;
the one set of memory cells is at a particular height in the stack;
another set of memory cells connected to the one word line are at the particular height;
the another set of memory cells comprises memory cells assigned to represent the second data state; and
a program-verify iteration of a first verify test in a programming operation for the another set of memory cells is based on a program-verify iteration of the first verify test in the programming operation for the one set of memory cells.

9. The apparatus of claim 4, wherein:
the one set of memory cells is among a plurality of memory cells formed along tapered memory holes in a stack of alternating conductive and dielectric layers;
the one set of memory cells is at a particular height in the stack;
another set of memory cells connected to another word line is at another height in the stack;
the another set of memory cells comprises memory cells assigned to represent the second data state; and
a program-verify iteration of a first verify test in a programming operation for the another set of memory cells is based on a program-verify iteration of the first verify test in the programming operation for the one set of memory cells and based on the another height.

10. A method, comprising:
performing initial program-verify iterations in a programming operation for a set of memory cells, the memory cells comprise memory cells assigned to a first data state among a plurality of data states and memory cells assigned to second data state among the plurality of data states;
during the initial program-verify iterations, obtaining a count of memory cells which pass a verify test of the first data state and determining that the count exceeds a threshold; and
in response to the obtaining the count and the determining that the count exceeds the threshold, determining a number of additional program-verify iterations of the programming operation to perform without performing a verify test of the second data state, before performing a program-verify iteration in which the memory cells assigned to the second data state are subject to the verify test of the second data state, the number is one or more program-verify iterations and is determined by accessing data which identifies different values of the number of additional program-verify iterations of the programming operation to perform without subjecting the memory cells assigned to the second data state to the verify test of the second data state, based on different values of the count.

11. The method of claim 10, wherein:
the second data state has a verify voltage which is higher than a verify voltage of the first data state.

12. The method of claim 10, wherein:
the memory cells which pass the verify test of the first data state comprise some of the memory cells assigned to represent the second data state.

13. An apparatus, comprising:
a set of memory cells; and
a control circuit, the control circuit configured to:
  begin a programming operation for the set of memory cells to program the set of memory cells to a plurality of data states, the plurality of data states comprising one data state and a next higher data state, the programming operation comprising a plurality of program-verify iterations;
  perform a verify test in the plurality of program-verify iterations for the one data state but not the next higher data state until a particular program-verify iteration in which a count of memory cells which pass the verify test for the one data state exceeds a threshold;
  in response to the count exceeding the threshold, perform the verify test in the plurality of program-verify iterations for the one data state but not the next higher data state during a number of additional program-verify iterations, the number is one or more and is a decreasing function of the count; and
  perform a first verify test in the plurality of program-verify iterations for the next higher data state after the number of additional program-verify iterations.

14. The apparatus of claim 13, wherein:
the memory cells which pass the verify test of the one data state comprise memory cells assigned to represent the one data state and memory cells assigned to represent the next higher data state.

15. The method of claim 10, further comprising:
classifying the count into a particular range of values among a plurality of ranges of values, wherein the number of additional program-verify iterations of the programming operation to perform without subjecting the memory cells assigned to the second data state to the verify test of the second data state is based on the particular range of values.

16. The apparatus of claim 13, further comprising:
a storage region associated with the control circuit, the storage region comprising parameters which identify different values of the number of additional program-verify iterations corresponding to different values of the count minus the threshold.

17. The apparatus of claim 1, wherein:
the number of program-verify iterations to skip is a decreasing function of the count.

18. The apparatus of claim 1, wherein:
the number of program-verify iterations to skip when the count is one or more and less than a particular number is greater than a number of program-verify iterations to skip when the count is more than the particular number.

19. The apparatus of claim 1, further comprising:
a storage region associated with the determination circuit, the storage region comprising parameters which identify different values of the number of program-verify iterations to skip based on different values of the count.

20. The apparatus of claim 1, wherein:
the number of program-verify iterations to skip is two or more when the count is less than a particular number and one or more when the count is more than the particular number.

* * * * *